(12) United States Patent
Taki et al.

(10) Patent No.: US 9,341,923 B2
(45) Date of Patent: May 17, 2016

(54) COMPOSITE PLASTIC MEMBER AND METHOD FOR PRODUCING THE SAME

(75) Inventors: Yusuke Taki, Sagamihara (JP); Yohei Takahashi, Yokohama (JP); Yujiro Urakawa, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 103 days.

(21) Appl. No.: 13/611,078

(22) Filed: Sep. 12, 2012

(65) Prior Publication Data

US 2013/0064536 A1    Mar. 14, 2013

Related U.S. Application Data

(60) Provisional application No. 61/535,585, filed on Sep. 16, 2011.

(30) Foreign Application Priority Data

Sep. 14, 2011   (JP) ................................. 2011-200843

(51) Int. Cl.
  *C23C 14/00*   (2006.01)
  *G03B 17/14*   (2006.01)
  (Continued)

(52) U.S. Cl.
  CPC ............ *G03B 17/14* (2013.01); *C23C 14/0641* (2013.01); *C23C 14/205* (2013.01); *C23C 14/345* (2013.01); *Y10T 428/2495* (2015.01)

(58) Field of Classification Search
  CPC .......................... C23C 14/345; C23C 14/0641
  USPC ...................... 204/192.12; 438/680; 257/761
  See application file for complete search history.

(56) References Cited

U.S. PATENT DOCUMENTS

| 4,943,486 A | 7/1990 | Uchiyama |
| 2005/0136656 A1* | 6/2005 | Zeng et al. .................... 438/680 |

(Continued)

FOREIGN PATENT DOCUMENTS

| JP | A-2-22452 | 1/1990 |
| JP | A-8-312779 | 11/1996 |

(Continued)

OTHER PUBLICATIONS

Oct. 30, 2012 International Search Report issued in Patent Application No. PCT/JP2012/073421 (with English-language translation).

*Primary Examiner* — Keith Hendricks
*Assistant Examiner* — Timon Wanga
(74) *Attorney, Agent, or Firm* — Oliff PLC

(57) ABSTRACT

A composite plastic member includes a first stacked body comprised of a plurality of chromium layers stacked on a plastic substrate; and a second stacked body comprised of a plurality of chromium nitride layers stacked on the first stacked body. Each of the first and second stacked bodies is formed such that a lower-hardness layer having a lower hardness than upper and lower layers which contact with and sandwich the lower-hardness layer therebetween and a higher-hardness layer having a higher hardness than upper and lower layers which contact with and sandwich the higher-hardness layer therebetween are alternately stacked in a stacking direction; and a thickness of a higher-hardness chromium nitride layer is not more than 40% of a thickness of a lower-hardness chromium nitride layer in the second stacked body. The composite plastic member has high wear resistance and satisfactory sliding performance, and the conductivity and excellent outer appearance.

7 Claims, 11 Drawing Sheets

(51) Int. Cl.
*C23C 14/06* (2006.01)
*C23C 14/20* (2006.01)
*C23C 14/34* (2006.01)

(56) References Cited

U.S. PATENT DOCUMENTS

2009/0273087 A1* 11/2009 French et al. ............... 257/761
2011/0186420 A1* 8/2011 Shi ........................... 204/192.12

FOREIGN PATENT DOCUMENTS

| | | |
|---|---|---|
| JP | A-2006-307317 | 11/2006 |
| JP | A-2007-092112 | 4/2007 |
| JP | A-2009-287099 | 12/2009 |
| JP | A-2009-293131 | 12/2009 |
| JP | A-2010-84202 | 4/2010 |
| JP | A-2010-242135 | 10/2010 |

* cited by examiner

COMPOSITE PLASTIC MEMBER AND METHOD FOR PRODUCING THE SAME

CROSS-REFERENCE TO RELATED APPLICATIONS

The present application claims priority from U.S. Provisional Patent Application No. 61/535,585 filed on Sep. 16, 2011 and claims priority from Japanese Patent Application No. 2011-200843 filed on Sep. 14, 2011, all the disclosures of which are incorporated herein by reference in their entirety.

FIELD OF THE INVENTION

The present invention relates to a composite plastic member which moves slidably relative to and is connected to another member such as a lens mount for a camera or a body mount for a camera, a lens for a camera and a body for a camera provided with the composite plastic member, and a method for producing the composite plastic member.

DESCRIPTION OF THE RELATED ART

As a connection member which moves slidably relative to and is detachably (releasably) connected to a connection surface of another member, there has been known a connection member having a coated film formed on a connection surface thereof. Such a connection member can be exemplified by a connection member referred to as a bayonet-type mount (hereinafter referred to as "mount" in an abbreviated manner as appropriate) provided on a body side and a lens side in a camera system configured so that a lens unit is detachable or removable with respect to a camera body. Since such a mount has been conventionally manufactured by machining brass, there is such a problem that the mount is not suitable for mass production due to a high production cost. In order to manufacture the mount at a lower cost and in a large quantity, plastic may be used as a material of the mount. It is possible to use the injection molding technique, in which a molten plastic material is injected into a mold or die having a predetermined shape, in order to manufacture a plastic mount.

However, it is required that the plastic mount to have high hardness, wear resistance, sliding performance (slidably moving performance) and durability in order that the plastic mount is used as the mount of the camera system as described above. Further, in some cases, the mount itself also is required to have conductivity in order that the camera body and the lens unit have the same ground potential. Furthermore, the plastic mount is also required to have beautiful metallic luster and corrosion resistance so as to ensure an external appearance quality of the camera.

As a wear-resistant component or part used in the engine and/or the transmission of a vehicle, etc., there has been known a mechanical component in which a nitrogen-containing chromium film is formed on a substrate made of steel, etc. For example, Japanese Patent Application Laid-open No. 2010-242135 discloses a nitrogen-containing chromium film member for a sliding component of an automobile, etc.

However, a camera mount is touched and operated directly by a user and is also a product in which user preference should be taken into consideration. Therefore, the camera mount is required to have characteristics which are not required for the sliding component of an automobile and/or for a machine for which only the operation performance and/or function is/are important. Therefore, there has been desired a mount member in which a plastic is used as the substrate; which has excellent wear resistance with respect to an attachment/detachment (installing/removing) operation performed repeatedly between a camera body mount and a plastic lens mount in order to attach and detach a lens with respect to the camera body mount; and which has satisfactory sliding performance, conductivity, and an excellent exterior appearance.

SUMMARY OF THE INVENTION

The present invention has been made taking the foregoing situation into consideration, an object of which is to provide a plastic member including a soft plastic substrate; and a film formed on the soft plastic substrate, the film having high wear resistance, satisfactory sliding performance, conductivity by which an electrical signal may be transmitted, and having excellent exterior appearance. Further, in addition to this, another object of the present invention is to provide a method for producing a plastic member in which the plastic member may be produced by a dry process.

According to a first aspect of the present teaching, there is provided a composite plastic member, including:
a plastic substrate;
a first stacked body comprised of a plurality of chromium layers stacked on the plastic substrate; and
a second stacked body comprised of a plurality of chromium nitride layers stacked on the first stacked body;
wherein the first stacked body is formed such that a lower-hardness chromium layer and a higher-hardness chromium layer are alternately stacked in a stacking direction, the lower-hardness chromium layer having a lower hardness than upper and lower chromium layers which contact with and sandwich the lower-hardness chromium layer therebetween, and the higher-hardness chromium layer having a higher hardness than upper and lower chromium layers which contact with and sandwich the higher-hardness chromium layer therebetween;
the second stacked body is formed such that a lower-hardness chromium nitride layer and a higher-hardness chromium nitride layer are alternately stacked in the stacking direction, the lower-hardness chromium nitride layer having a lower hardness than upper and lower chromium nitride layers which contact with and sandwich the lower-hardness chromium nitride layer therebetween, and the higher-hardness chromium nitride layer having a higher hardness than upper and lower chromium nitride layers which contact with and sandwich the higher-hardness chromium nitride layer therebetween; and a thickness of a higher-hardness first chromium nitride layer is not more than 40% of a thickness of a lower-hardness second chromium nitride layer in the second stacked body.

According to a second aspect of the present teaching, there is provided a method for producing a composite plastic member, the method including: a step of forming a first stacked body, in which a chromium layer is alternately formed, on a plastic substrate by alternately forming the chromium layer by FCVA (Filtered Cathodic Vacuum Arc Method) and the chromium layer by sputtering; and a step of forming a second stacked body, in which a chromium nitride layer is alternately formed, on the first stacked body by alternately forming the chromium nitride layer by the FCVA and the chromium nitride layer by the sputtering.

EMBODIMENTS FOR CARRYING OUT THE INVENTION

Hereinbelow, an explanation will be made about an embodiment of a composite plastic member with reference to drawings.

[Structure of Composite Plastic Member]

Figure 1:
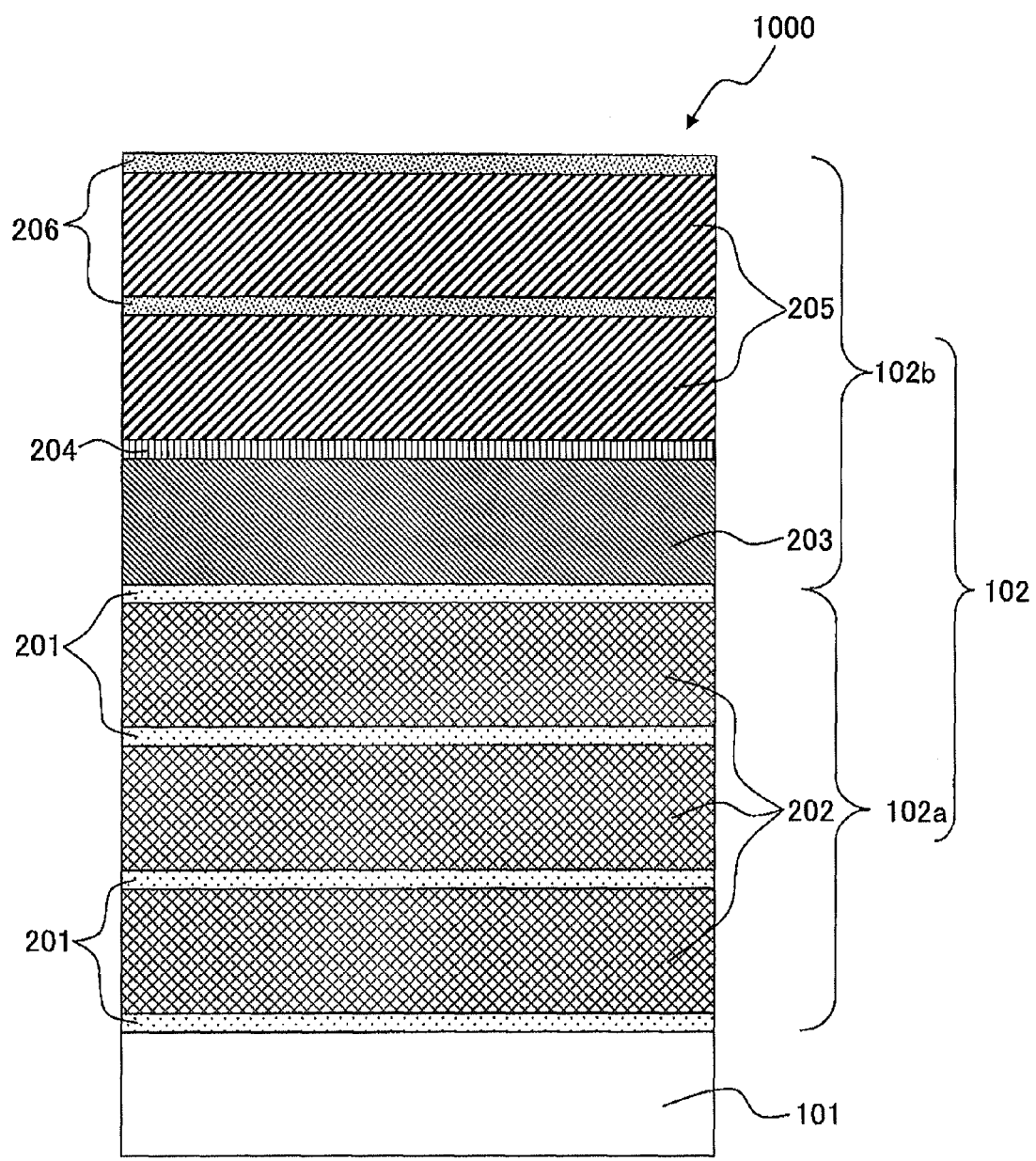
FIG. 1 is a cross-sectional view schematically showing a composite plastic member produced in Example 1.

FIG. 1 shows a structural example of a composite plastic member of this embodiment. As shown in FIG. 1, a composite plastic member 1000 is provided with a stacked body 102 on a plastic substrate 101. The stacked body 102 includes a first stacked body 102a provided on the plastic substrate 101 and a second stacked body 102b provided on the first stacked body 102a.

It is possible to use various plastics as the plastic substrate 101; and a resin suitable for a mass-produced process, such as the injection molding, is preferable. For example, it is possible to use various thermoplastic resins, such as a fluorine-based resin including, for example, polycarbonate, polyethylene, polyvinyl chloride, polystyrene, ABS resin, polypropylene, polyvinyl acetate, acrylic resin (PMMA), polyethylene terephthalate (PET), and polytetrafluoroethylene (PTFE); polyetheretherketone (PEEK); polyamideimide (PAI); polyphenylene sulfide (PPS); polyester resin; and a resin in which a glass fiber or a carbon fiber is added to each of the resins described above.

The first stacked body 102a is formed by alternately stacking two kinds of chromium layers which contact with each other from above and below (in a up/down or vertical direction) and which have mutually different hardnesses (by alternately stacking two kinds of chromium layers having mutually different hardnesses in the up/down or vertical direction, each of the two kinds of chromium layers has a hardness different from those of upper and lower chromium layers which contact with and sandwich each of the two kinds of chromium layers therebetween). More specifically, the first stacked body 102a is formed by alternately stacking a relatively higher-hardness chromium layer (high-hardness chromium layer) 201 of which hardness is relatively high and a relatively lower-harness chromium layer (low-hardness chromium layer) 202 of which hardness is relatively low. The phrase that the high-hardness chromium layer and the low-hardness chromium layer are "stacked alternately" means that at least one pair of high-hardness and low-hardness chromium layers which contact with each other from above and below is formed. However, in order to obtain sufficient durability in a use in which the sliding movement (sliding) is repeated over a long period of time, it is more preferable, as the number of stacked interfaces are greater because, namely, in a case that the film is worn and exfoliated (peeled off) by the sliding, the film is always exfoliated in a stacked interface having a relatively weak bonding force. Consequently, the sliding durability becomes higher, as the number of the stacked interfaces is greater. In such a viewpoint, it is preferable that three or more pairs of the high-hardness and low-hardness chromium layers are formed.

With respect to the structure of the first stacked body 102a, the chromium layers which contact with each other from above and below may have different degrees of hardness; a plurality of high-hardness chromium layers may have different degrees of hardness; or a plurality of low-hardness chromium layers may have different degrees of hardness. Considering action of the high-hardness chromium layer and action of the low-hardness chromium layer as will be described later on, the difference, in hardness between the high-hardness chromium layer and the low-hardness chromium layer is preferably as follows: the hardness of the high-hardness chromium layer is higher by not less than 10%, preferably by not less than 20%, and more preferably by not less than 30% than the hardness of the low-hardness chromium layer.

The second stacked body 102b is formed by alternately stacking two kinds of chromium nitride layers which contact with each other from above and below (in a up/down direction) and which have mutually different hardnesses (by alternately stacking two kinds of chromium nitride layers having mutually different hardnesses in the up/down or vertical direction, each of the two kinds of chromium nitride layers has a hardness different from those of upper and lower chromium nitride layers which contact with and sandwich each of the two kinds of chromium nitride layers therebetween). More specifically, the second stacked body 102b is formed such that a relatively higher-hardness chromium nitride layer (high-hardness chromium nitride layer) 204 (or 206) and a relatively lower-hardness chromium nitride layer (low-hardness chromium nitride layer) 203 (or 205) which contact with each other from above and below are alternately stacked, the high-hardness chromium nitride layer 204 (or 206) having a relatively high hardness and the low-hardness chromium nitride layer 203 (or 205) having a relatively low hardness. The phrase that the high-hardness chromium nitride layer and the low-hardness chromium nitride layer which contact with each other from above and below are "stacked alternately" means that at least one pair of high-hardness and low-hardness chromium nitride layers which contact with each other from above and below is formed. However, in order to obtain the sufficient durability in the use in which the sliding is repeated over the long period of time, it is more preferable, as the number of stacked interfaces are greater because, namely, in a case that the film is worn and exfoliated by the sliding, the film is always exfoliated in a stacked interface having a relatively weak bonding force. Consequently, the sliding durability becomes higher, as the number of the stacked interfaces is greater. From this viewpoint, it is preferable that two or more pairs of the high-hardness and low-hardness chromium nitride layers are formed. With respect to the structure of the second stacked body 102b, the chromium nitride layers which contact with each other from above and below may have different degrees of hardness; a plurality of high-hardness chromium nitride layers may have different degrees of hardness; or a plurality of low-hardness chromium nitride layers may have different degrees of hardness. In the example as shown in FIG. 1, a high-hardness chromium nitride layer 206 as an upper layer has a hardness which is substantially same as that of a high-hardness chromium nitride layer 204 as a lower layer; and a low-hardness chromium nitride layer 205 as an upper layer has a hardness higher than that of a low-hardness chromium nitride layer 203 as a lower layer. Considering the action of the high-hardness chromium nitride layer and the action of the low-hardness chromium nitride layer as will be described later on, the relationship in hardness between the high-hardness chromium nitride layer and the low-hardness chromium nitride layer is preferably as follows: the hardness of the high-hardness chromium nitride layer is higher by not less than 10%, preferably by not less than 20%, and more preferably by not less than 30% than the hardness of the low-hardness chromium nitride layer.

As described above, the first stacked body is comprised of the chromium layers, the second stacked body is comprised of the chromium nitride layers, and both of the first and second stacked bodies are formed so that the layers contacting with each other from above and below (in up/down direction) have different degrees of hardness; and thus the composite plastic member can satisfy all of the following characteristics: the high hardness, the wear resistance, the sliding performance, the adhesion, the conductivity, and the excellent exterior appearance for the following reason. That is, since both of the chromium layer and the chromium nitride layer contain the chromium, the chromium layer and the chromium nitride layer adhere well each other. However, when comparing the chromium layer and the chromium nitride layer, the chromium layer has lower hardness and has hardness close to that of a plastic substrate of which hardness is lower than that of the metal. Further, the chromium layer has a larger number of voids (the chromium layer is porous) than the chromium nitride layer. That is, the chromium nitride layer is denser than the chromium layer. Therefore, the chromium layer has high adhesion (high adherability) to the plastic substrate. Accordingly, the first stacked body, which is close to a side of the plastic substrate, is formed of the chromium layers, thereby making it possible to improve the adhesion to the plastic substrate. On the other hand, it is desirable that the outside of the composite plastic member is formed of a material having the high-hardness in order to provide satisfactory sliding performance and wear resistance. Accordingly, it is ideally desirable that the hardness is gradually increased toward an outside surface of the composite plastic member. Thus, the second stacked body is formed of the chromium nitride layers. Here, when assuming a case that the stacked body 102 or the first stacked body 102a is entirely formed only of chromium layers having a same hardness, namely, a case that the stacked body 102 or the first stacked body 102a is entirely formed of a single kind of chromium layers, the entire stacked body 102 cannot have any high mechanical strength; in particular, the wear resistance is inferior. Further, when assuming a case that the stacked body 102 or the second stacked body 102b is entirely formed only of chromium nitride layers having a same hardness, namely, a case that the stacked body 102 or the second stacked body 102b is entirely formed of a single kind of chromium nitride layers, the entire stacked body 102 has a high-hardness, but the stacked body 102 is fragile, has low toughness, and is more likely to be exfoliated from the plastic substrate.

On the other hand, by forming the first stacked body 102a of an alternate stacked body comprised of the high-hardness chromium layers and the low-hardness chromium layers, it is possible to improve the adhesion to the plastic substrate and to maintain the mechanical strength of the entire first stacked body 102a. Further, by forming the second stacked body 102b of an alternate stacked body comprised of the high-hardness chromium nitride layers and the low-hardness chromium nitride layers, it is possible to improve the toughness of the entire second stacked body 102b. In particular, in both of the first stacked body 102a and the second stacked body 102b, each of the high-hardness layers inserted alternately with respect to each of the low-hardness layers maintains the hardness of each of the entire stacked bodies 102a and 102b, and each of the low-hardness layers also functions as a layer to relax or mitigate stress of each of the stacked bodies. As described above, since the composite plastic member of the embodiment adopts the two kinds of alternate stacked structures formed of the metal and metal nitride, the softness (stress relaxation characteristic) possessed by the chromium and the hardness possessed by the chromium nitride are exhibited effectively, thereby making it possible for the composite plastic member to have the wear resistance, the toughness, and the sliding performance together. Note that by making a nitrogen-content amount of the chromium nitride lower than the stoichiometric amount (1:1), free electron is generated, thereby making it possible for the composite plastic member to have the conductivity as well as the metallic luster.

In the first stacked body, the high-hardness chromium layer may be configured to have a small number of voids and to be dense; on the other hand, the low-hardness chromium layer may be configured to have a layer structure having a larger number of voids (porous) than the high-hardness chromium layer. Further, the high-hardness chromium layer may be configured to have an isotropic cross-sectional structure; on the other hand, the low-hardness chromium layer may be configured to have an anisotropic cross-sectional structure such as a columnar shape. Furthermore, the high-hardness chromium layer may be configured to have a relatively smooth or planar surface; on the other hand, the low-hardness chromium layer may be configured to have a surface rougher than the high-hardness chromium layer. It is considered that, by alternately stacking the high-hardness chromium layer and low-hardness chromium layer having mutually different layer structures, not only the adhesion of the first stacked body (or entire stacked body) to the plastic substrate and the toughness of the first stacked body (or entire stacked body) but also the mechanical strength are improved.

In the second stacked body, the high-hardness chromium nitride layer may be configured to have a small number of voids and to be dense; on the other hand, the low-hardness chromium nitride layer may be configured to have a layer structure having a larger number of voids than the high-hardness chromium nitride layer. Further, the high-hardness chromium nitride layer may be configured to have an isotropic cross-sectional structure; on the other hand, the low-hardness chromium nitride layer may be configured to have an anisotropic cross-sectional structure such as a columnar shape. Furthermore, the high-hardness chromium nitride layer may be configured to have a relatively smooth or planar surface; on the other hand, the low-hardness chromium nitride layer may be configured to have a surface rougher than the high-hardness chromium nitride layer. It is considered that the difference between the layer structure of the high-hardness chromium nitride layer and the layer structure of the low-hardness chromium nitride layer contributes to not only the excellent adhesion of the second stacked body (or the entire stacked body) to the plastic substrate and the first stacked body and the high mechanical strength of the second stacked body (or the entire stacked body) but also the high toughness.

The entire thickness of the first stacked body 102a comprised of the chromium layers is preferably 100 nm to 800 nm and is more preferably 200 nm to 700 nm. In a case that the entire thickness is thinner than 100 nm, the number of times for which the first stacked body can withstand an attachment and detachment operation is reduced, and thus it is not preferable. In a case that the entire thickness is thicker than 800 nm, the adhesion of the entire first stacked body to the plastic substrate becomes insufficient, and thus it is not preferable. In the first stacked body 102a, the film thickness (thickness) of a high-hardness chromium layer 201 is preferably thinner than the film thickness of a low-hardness chromium layer 202 for the following reason. That is, the high-hardness chromium layer 201 is relatively fragile (brittle, weak) and the low-hardness chromium layer 202 functions as a stress relaxation layer. In particular, the film thickness of the high-hardness chromium layer 201 is preferably not more than 50% of the film thickness of the low-hardness chromium layer 202, is more preferably not more than 40% of the film thickness of the low-hardness chromium layer 202. Note that, in the present application, the phrase that "the film thickness of the high-hardness chromium layer in the first stacked body is not more than 50% (or 40%) of the film thickness of the low-hardness chromium layer" means a relationship with respect to the film thicknesses of the layers in the first stacked body, except for the lowermost chromium layer (layer tightly adhered to the plastic substrate). The thickness of the high-hardness chromium layer 201 is preferably 10 nm to 70 nm and is more preferably 20 nm to 40 nm. In a case that the film thickness of the high-hardness chromium layer 201 is thinner than 10 nm, the high-hardness chromium layer 201 becomes ununiform, and thus it is not preferable. In a case that the film thickness of the high-hardness chromium layer 201 is thicker than 70 nm, the compressive stress of the entire first stacked body becomes too high, which in turn decreases the adhesion of the first stacked body to the plastic substrate, and thus it is not preferable. The thickness of the low-hardness chromium layer 202 is preferably 30 nm to 400 nm and is more preferably 50 nm to 250 nm. In a case that the entire thickness is thinner than 30 nm, it is not possible to make the film thickness of the high-hardness chromium layer 201 be more than 50% of the film thickness of the low-hardness chromium layer 202, and thus it is not preferable. In a case that the entire thickness is thicker than 400 nm, the entire structure of the first stacked body become fragile or brittle and the mechanical strength is reduced, and thus it is not preferable.

In the first stacked body 102a, it is preferably that the high-hardness chromium layer is formed first on the plastic substrate (as the first layer). This is because the strong adhesion is secured.

The hardness of the chromium nitride layer is influenced by a film-forming method (FCVA, sputtering), the nitrogen-content amount, and the presence or absence of bias application. Further, in a use in which the composite plastic material is required to have the conductivity, the chromium nitride layer is required to have the conductivity. From this viewpoint, as the atomic ratio (N/Cr) of nitrogen with respect to chromium, the nitrogen-content amount in the chromium nitride forming the second stacked body is preferably 0.1 to 0.7 in the high-hardness chromium nitride layer and the low-hardness chromium nitride layer. In particular, from the viewpoint of stability of the hardness (production stability) with respect to change in the nitrogen-content amount, the nitrogen-content amount is preferably 0.1 to 0.5 in the high-hardness chromium nitride layer and is preferably 0.1 to 0.4 in the low-hardness chromium nitride layer.

The entire thickness of the second stacked body 102b comprised of the chromium nitride layers is preferably 100 nm to 1100 nm and is more preferably 200 nm to 1000 nm. In a case that the entire thickness is thinner than 100 nm, any sufficient mechanical strength and durability for the entire stacked body cannot be obtained, and thus it is not preferable. In a case that the entire thickness is thicker than 1100 nm, a film-forming time becomes long and productivity is decreased, and thus it is not preferable. Also in the second stacked body 102b, the film thickness of each of the low-hardness chromium nitride layers 203, 205 is preferably thicker than the film thickness of each of the high-hardness chromium nitride layers 204, 206 for the following reason. That is, each of the high-hardness chromium nitride layers 204, 206 is relatively fragile (brittle, weak); and each of the low-hardness chromium nitride layers 203, 205 functions as the stress relaxation layer. Note that in the composite plastic member, each of the high-hardness chromium nitride layers 204, 206 is arranged at a position closer to the outside of the composite plastic member than each of the high-hardness chromium layers 201 of the first stacked body 102a, thereby realizing the excellent sliding performance and wear resistance of the composite plastic member. For such a purpose described above, each of the high-hardness chromium nitride layers 204, 206 has the higher hardness than that of the high-hardness chromium layer 201. The film thickness of each of the high-hardness chromium nitride layers 204, 206 is not more than 40% of the film thickness of each of the low-hardness chromium nitride layers 203, 205. In a case that the composite plastic member is used for a usage in which the composite plastic member is brought in contact with and/or slidably moves (slides) with respect to another member, it is desirable that the uppermost layer of the second stacked body is formed of the high-hardness chromium nitride layer. In this case, the high-hardness chromium nitride layer is subsequently formed on the uppermost layer of the second stacked body, and as a result, the thickness of the uppermost high-hardness chromium nitride layer exceeds 40% of the film thickness of low-hardness chromium nitride layer in some cases. Therefore, in the present application, the phrase that "the film thickness of the high-hardness chromium nitride layer in the second stacked body is not more than 40% of the film thickness of the low-hardness chromium nitride layer" means a relationship with respect to the film thickness between the high-hardness chromium nitride layer and the low-hardness chromium nitride layer which contact with each other from above and below, in the second stacked body, except for the uppermost chromium nitride layer. Note that a protecting layer formed of a material different from that of the chromium nitride layer may be provided on the uppermost high-hardness chromium nitride layer.

[Method for Producing Composite Plastic Member]

According to a method for producing a composite plastic member according to the above-described aspect, it is found out not only that the stacked body comprised of the hard metal layers and/or the metal nitride layers (chromium layers and/or chromium nitride layers) can be satisfactorily adhered on the soft plastic substrate by alternately stacking, on the plastic substrate, the chromium layer and/or the chromium nitride layer by the FCVA and the chromium layer and/or the chromium nitride layer by the sputtering; but also that, as compared with a case in which the layers are stacked only by the sputtering, it is possible to improve the mechanical strength of the metal layers such as the wear resistance, the toughness, and the sliding performance. In particular, by alternately stacking the chromium layer by the FCVA and the chromium layer by sputtering and by alternately stacking the chromium nitride layer by the FCVA and the chromium nitride layer by the sputtering on the plastic substrate, the stacked body comprised of the hard chromium layers and the chromium nitride layers can be satisfactorily adhered on the soft plastic substrate; and the composite plastic member having the excellent mechanical strength such as the wear resistance, the toughness, and the sliding performance was provided successfully. In the present application, the term "FCVA" includes not only FCVA in a narrow sense (Filtered Cathodic Vacuum Arc Method) but also a cathodic vacuum arc method or vacuum arc method having a function (filter function) which classifies elements such as a specific ionized carbon, etc., and a method similar to the cathodic vacuum arc method or the vacuum arc method, for example, AIP (Arc Ion Plating Method).

Although the FCVA and the sputtering are film-forming methods both using a dry process, the respective films (layers) formed by these methods have differences in the degrees of hardness and/or the layer structures. For example, the chromium layer formed by the FCVA is denser than the chromium layer formed by the sputtering; and the chromium layer formed by the FCVA has the isotropic structure. On the other hand, the chromium layer formed by the sputtering has a large number of voids and has the anisotropic columnar structure. From the differences between the layer structures as described above, the chromium layer formed by the FCVA has a higher hardness than the chromium layer formed by the sputtering, but the chromium layer formed by the FCVA has the following characteristics: namely, any stress-strain is more likely to occur in the chromium layer formed by the FCVA than in and is more fragile (weaker) than the chromium layer formed by the sputtering; and that the chromium layer formed by the sputtering has a lower hardness than the chromium layer formed by the FCVA, but has the stress relaxation characteristic. Further, as described above, when comparing the chromium layer with the chromium nitride layer, the chromium nitride layer has a higher hardness than the chromium layer and has a denser structure than the chromium layer. Therefore, by using the different film-forming methods in combination to form the chromium layer and the chromium nitride layer, it is possible to provide not only the difference in the material but also the difference in the layer structure due to the difference in the process, thereby making it possible to provide a desired hardness distribution in a direction of the film thickness (film thickness direction) (stacking direction) of the stacked body. As a result, it is possible to form the composite plastic member having not only the adhesion to the plastic but also the excellent mechanical strength.

In a case that the composite plastic member was produced under various conditions by using the FCVA and the sputtering in Example 1 as will be described later on, the present inventors performed analysis as to what kinds of microstructure, chemical composition and hardness were possessed by each of the layers (single-layer film) forming the stacked body. The chromium layers and the chromium nitride layers were produced individually, on silicon substrates, by using the FCVA and the sputtering so that each of the chromium layers and the chromium nitride layers was formed as the single-layer film having a thickness of 100 nm. Further, at the time of forming the single-layer films by using the FCVA and the sputtering, the following two cases were also carried out: a case in which a bias voltage was applied to the silicon substrate and a case in which the bias voltage was not applied to the silicon substrate. Then, these cases were considered by comparing with each other. Since the plastic substrate is an insulator, the bias voltage cannot be applied from an initial stage of the film-forming process. Therefore, the silicon substrate was used in an evaluation of the single-layer film.

As will be described in an example in detail, a chromium single-layer film formed by the FCVA without applying the bias voltage had a small number of voids, was dense, and had a relatively smooth surface (see FIGS. 3 and 4). On the other hand, a chromium single-layer film formed by the sputtering without applying the bias voltage had a larger number of voids than the chromium single-layer film formed by the FCVA, had an anisotropic columnar structure and a rough surface (see FIGS. 5 and 6). Further, a chromium nitride single-layer film formed by the FCVA without applying the bias voltage had a dense and isotropic structure having no void at all and had an extremely smooth surface (see FIGS. 7 and 8). On the other hand, a chromium nitride single-layer film formed by the sputtering without applying the bias voltage had a large number of voids, had an anisotropic columnar structure and a rough surface (see FIGS. 9 and 10). A chromium nitride single-layer film formed by the FCVA while applying the bias voltage had a dense and isotropic structure having no void at all and had an extremely smooth surface (see FIGS. 11 and 12). On the other hand, a chromium nitride single-layer film formed by the sputtering while applying the bias voltage had a large number of voids, had an anisotropic columnar structure and a rough surface (see FIGS. 13 and 14), although extents of these characteristic were less remarkable as compared with the case of the chromium nitride single-layer film formed without applying the bias voltage.

When comparing the hardness of the films of the single-layer films formed under the conditions as described above, the following facts have been found out: (i) irrespective of the film-forming methods, each of the chromium nitride films is harder than each of the chromium films; (ii) each of the chromium films formed by the FCVA is harder than each of the chromium films formed by the sputtering; (iii) each of the chromium nitride films formed by the FCVA is harder than each of the chromium nitride films formed by the sputtering; (iv) with respect to each of the chromium nitride films formed by the FCVA, the hardness of the film is hardly influenced by the presence or absence of application of the bias voltage to the plastic substrate; and (v) with respect to each of the chromium nitride films formed by the sputtering, the film formed by applying the bias voltage to the plastic substrate is harder than the film formed without applying the bias voltage. Although the chromium nitride film formed by the FCVA is sufficiently dense even without being applied with the bias voltage, the chromium nitride film formed by the sputtering has a relatively large number of voids. Thus, it is considered that the film is formed denser by further accelerating charged particle(s) due to the application of the bias voltage.

In order to produce the stacked body having the structure as shown in FIG. 1, the present inventors arrived at a producing method, based on the result of analysis as described above, by combining: forming the first stacked body comprised of the chromium layers on the plastic substrate by alternately stacking the chromium layer by the FCVA and the chromium layer by the sputtering; and forming the second stacked body comprised of the chromium nitride layers on the first stacked body by alternately stacking the chromium nitride layer by the FCVA and the chromium nitride layer by the sputtering. Further, according to the result of the analysis as described above, the bias voltage needs not to be applied in a case that the chromium layers are formed by the FCVA and the sputtering, respectively; and it is desirable that the bias voltage is applied when forming at least a part of the chromium nitride layers, in particular a layer close to an outside surface of the second stacked body, by the sputtering. By doing so, it is possible to form the films having different kinds of hardness in accordance with the six kinds of conditions as described above and to freely produce the stacked body having the desired hardness distribution in the stacking direction.

[Manufacturing Apparatus of Stacked Body]

A step of alternately stacking the chromium layer by the FCVA and the chromium layer by the sputtering; and a step of alternately stacking the chromium nitride layer by the FCVA and the chromium nitride layer by the sputtering can be performed by using a FCVA apparatus and a sputtering apparatus. In order to improve the throughput at the time of producing the composite plastic member, it is desirable that chamber (s) etc., are commonly used for the FCVA apparatus and the sputtering apparatus to form the films continuously by the FCVA and the sputtering at a same place. From this viewpoint, an apparatus as shown in FIG. 2 is used in this embodiment.

Figure 2:
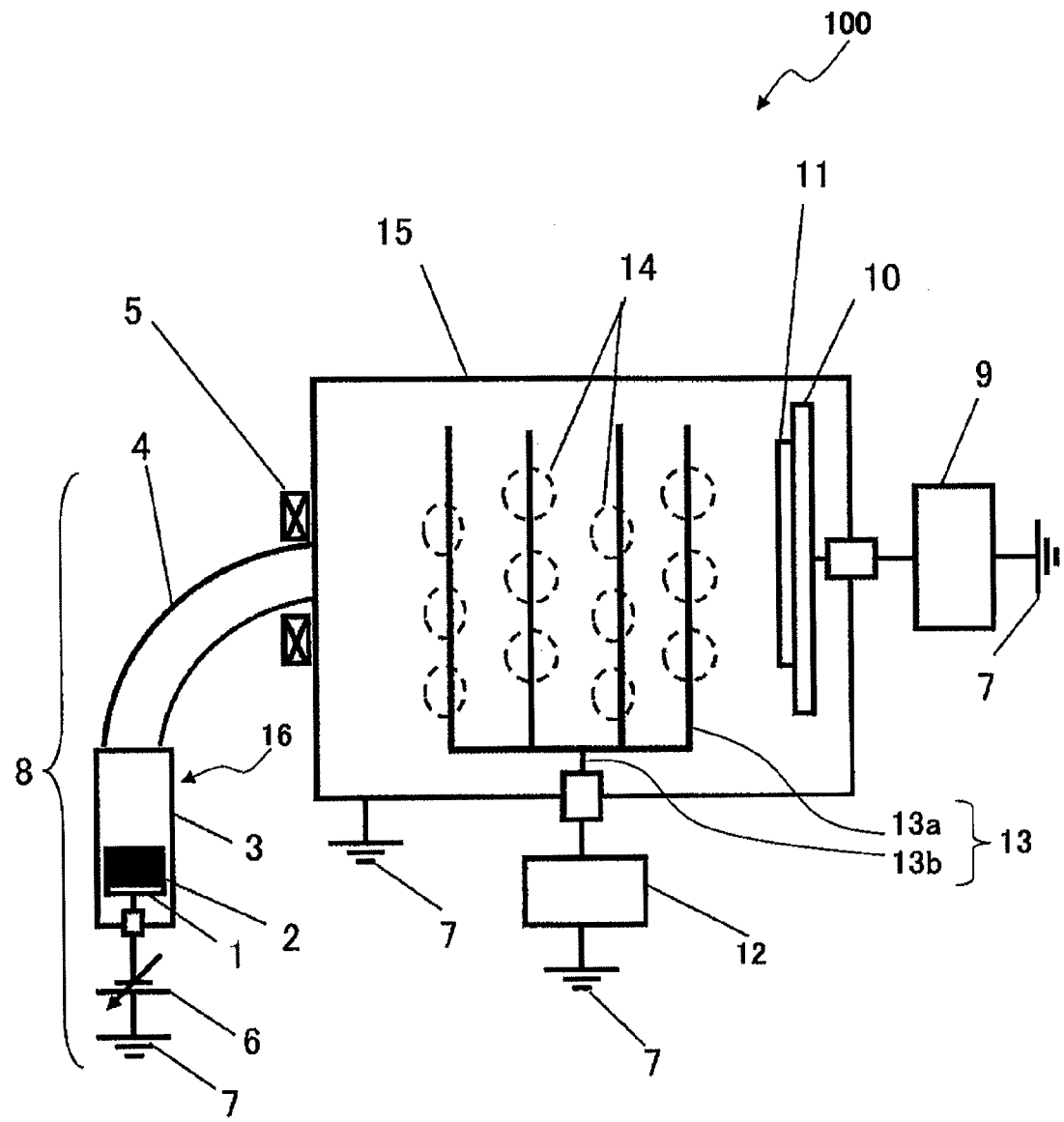
FIG. 2 schematically shows a film-forming apparatus used in Example 1.

A film-forming apparatus 100 as shown in FIG. 2 is an apparatus which is capable of continuously forming films in a common film-forming chamber 15 by two kinds of methods that are the FCVA and the sputtering. The film-forming apparatus 100 is mainly provided with the film-forming chamber 15, a FCVA source 8 connected to the film-forming chamber 15, a rotating/revolving holder 13 which holds plastic substrates 14 arranged in the film-forming chamber 15, a sputtering cathode 10, and a sputtering chromium target 11 arranged on the sputtering cathode 10. A bias power supply 12 connected to the rotating/revolving holder 13 and a sputtering power source 9 connected to the sputtering cathode 10 are provided outside the film-forming chamber 15. The bias power supply 12, the sputtering power source 9, and a FCVA direct-current power supply 6 as will be described later on are grounded via respective ground sections 7. Further, although not shown, a vacuum device by which pressure in the film-forming chamber 15 is reduced to create a vacuum therein and a gas-introducing pipe to introduce an argon gas and a nitrogen gas into the film-forming chamber 15 are provided in the film-forming chamber 15.

At first, an explanation will be made about component (s) and operation (s) of the film-forming apparatus 100 required for forming the film by the FCVA. The FCVA source 8 is mainly constructed of an arc plasma producing section 16 and an electromagnetic filter 4. The arc plasma producing section 16 and the film-forming chamber 15 are connected by the duct-shaped electromagnetic filter 4. The arc plasma producing section 16 is provided with a FCVA cathode 1, a FCVA anode 3 (striker), and a FCVA chromium target 2 sandwiched between the FCVA cathode 1 and the FCVA anode 3. Here, the FCVA anode 3 also functions as a container which accommodates the FCVA chromium target 2 and the FCVA cathode 1. The FCVA cathode 1 is connected to the FCVA direct-current power supply 6 provided outside the container.

By separating the FCVA anode 3 (striker) from the FCVA chromium target 2 immediately after the FCVA anode 3 is brought in contact with the FCVA chromium target 2, arc discharge is caused to generate an arc plasma (chromium plasma). Neutral particle(s) produced by the arc plasma and positively ionized chromium fly in the electromagnetic filter 4 toward the film-forming chamber 15.

An unillustrated electromagnetic coil is wound around an outer circumference portion of the duct-shaped electromagnetic filter 4. Further, a coil 5 for scanning FCVA beam (FCVA beam scanning coil 5) is provided in the vicinity of a connecting portion connecting the duct-shaped electromagnetic filter 4 with the film-forming chamber 15. The duct-shaped electromagnetic filter 4 is bent twice, in two directions perpendicular to each other, between the arc plasma producing section 16 and the film-forming chamber 15; and the electromagnetic coil is wound around the outer circumference portion of the duct-shaped electromagnetic filter 4. Since the electromagnetic filter 4 has such a bend structure (double-bend structure), the particles flowing in the electromagnetic filter 4 collide with the inner wall surface thereof or flow along the wall surface thereof. By passing an electric current through the electromagnetic coil in the double-bend structure, Lorentz force is operated on the charged particles flowing inside the electromagnetic filter 4 to change a flying path of the charged particles.

Therefore, by optimizing electric power applied to the electromagnetic coil with respect to mass of ionized chromium atom (chromium ion), charged particles which are lighter and/or heavier than the chromium ion and neutral particles which do not bend by the Lorentz force are accumulated on the inner wall of the electromagnetic filter 4 to be removed, thereby making it possible to introduce only the chromium ion to the film-forming chamber 15 with high efficiency. That is, the electromagnetic filter 4 functions as an electromagnetic spatial filter for a narrow band through which only the desired particles are passed with high efficiency.

In the film-forming chamber 15, the plastic substrates 14 are held by the rotating/revolving holder 13 so as to face an exit of the electromagnetic filter 4. The rotating/revolving holder 13 includes a plurality of rotation axes 13a aligned to be rotationally symmetric around a revolution axis 13b and each of the rotation axes 13a holds the substrates 14. During the film-forming process, the substrates 14 revolve around the revolution axis 13b while rotating around each of the rotation axes 13a. It is possible to arbitrarily apply the bias voltage to the rotating/revolving holder 13 by the bias power supply 12. The FCVA beam scanning coil 5 scans a chromium ion beam, which passes through the electromagnetic filter 4 and then enters the film-forming chamber 15, and uniformly forms the chromium layer or the chromium nitride layer on the surface of each of the substrates 14 held by the rotating/revolving holder 13.

In a case that the chromium layer is formed by the FCVA, the pressure in the film-forming chamber 15 is reduced to a high degree of vacuum by the unillustrated vacuum device. In a case that the chromium nitride layer is formed by the FCVA, the film is formed under a nitrogen gas atmosphere by introducing the nitrogen gas into the film-forming chamber 15 from the unillustrated gas-introducing pipe. The chromium ion beam, which passes through the electromagnetic filter 4 and then enters the film-forming chamber 15, reacts with a nitrogen plasma in the film-forming chamber 15 to arrive at the surface of each of the substrate 14, thereby making it possible to form the chromium nitride layer.

Next, an explanation will be made about component(s) and operation(s) of the film-forming apparatus 100 required for forming the film by the sputtering. In a case that the chromium layer is formed by the sputtering, at first, the argon gas is introduced into the film-forming chamber 15 via the unillustrated gas-introducing pipe so as to provide an argon gas atmosphere inside the film-forming chamber 15. Then, a predetermined voltage is applied to the sputtering chromium target 11 by the sputtering power source 9 to generate glow discharge (low-temperature plasma) in the vicinity of the sputtering chromium target 11. Accordingly, the argon gas in the discharge area is ionized to collide with the sputtering chromium target 11 at high speed; the chromium atoms are driven out from the sputtering chromium target 11 by this collision; and the chromium atoms arrive at the surface of each of the substrates 14 to form the chromium layer on the surface of each of the substrates 14.

In a case that the chromium nitride layer is formed by the sputtering, the argon gas and the nitrogen gas are introduced into the film-forming chamber 15 via the unillustrated gas-introducing pipe so as to provide the argon-nitrogen gas atmosphere inside the film-forming chamber 15. Then, the voltage is applied to the sputtering chromium target 11 by the sputtering power source 9 to generate the glow discharge (low-temperature plasma) in the vicinity of the sputtering chromium target 11. Accordingly, the argon gas in the discharge area is ionized to collide with the sputtering chromium target 11 at high speed; the chromium atoms are driven out from the sputtering chromium target 11 by this collision; and the chromium atoms react with the nitrogen plasma under the argon-nitrogen gas atmosphere in the film-forming chamber 15 to form the chromium nitride layer on a surface of each of the substrates 14.

By alternately repeating the film-forming by the FCVA and the film-forming by the sputtering, it is possible to produce an alternate stacked film efficiently.

[Mount Using Composite Plastic Member, Interchangeable Lens, and Camera]

Figure 15:
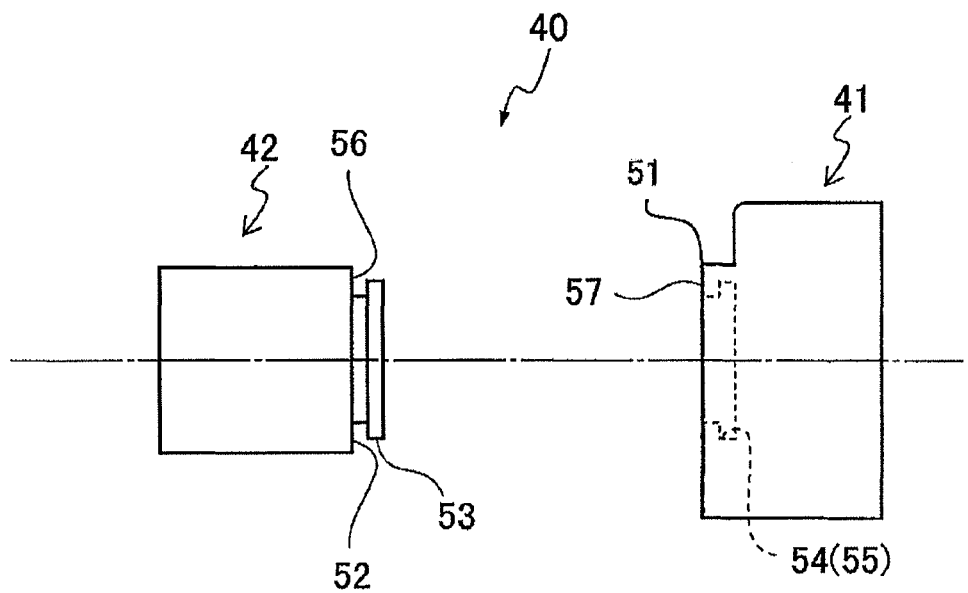
FIG. 15 schematically shows a camera system including an interchangeable lens (exchange lens) which is detachable with respect to a camera body.
Figure 16A:
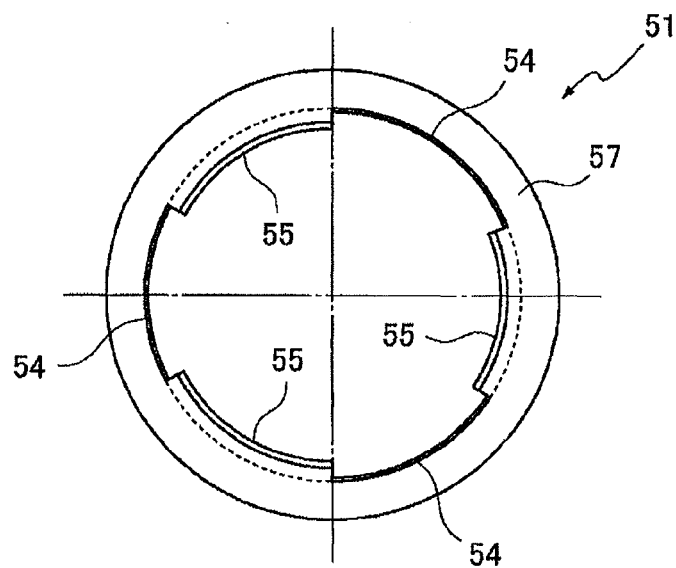
FIG. 16A is a plan view of a bayonet-type mount disposed on a side of the camera body as shown in FIG. 15.
Figure 16B:
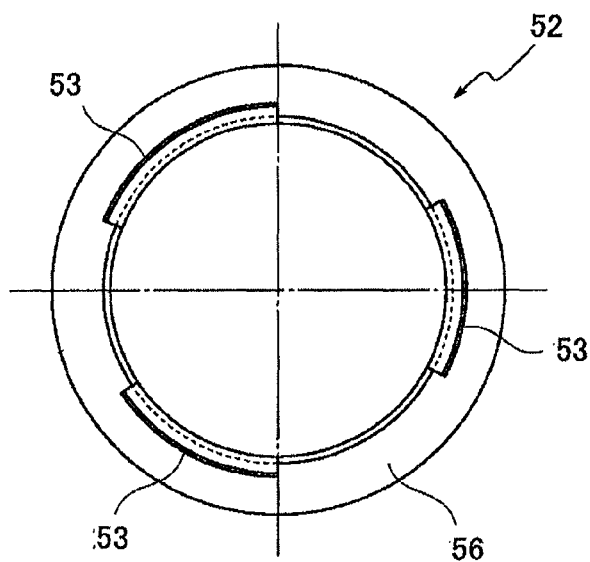
FIG. 16B is a plan view of a bayonet-type mount disposed on a side of the interchangeable lens as shown in FIG. 15.

The composite plastic member can be used for members or components in various uses in view of the high wear resistance, the satisfactory sliding performance, the conductivity, and the excellent exterior appearance. In particular, the composite plastic member is suitable for a member which moves slidably relative to another member and/or a member which is connected to or joined to another member while moving slidably relative to another member. Further, the composite plastic member is suitable also for a pair of members slidably moving relative to each other; and/or a member set and/or a member kit connected to or joined to each other while slidably moving relative to each other. In particular, the composite plastic member is suitable for a mount member, disposed on a side of a lens unit of the camera, in which the lens unit is detachable with respect to a camera body, and/or a mount member disposed on a side of the camera body of said camera. An explanation will be briefly made about these mount members with reference to FIG. 15, FIG. 16A, and FIG. 16B. A camera 40, such as a single lens reflex, generally includes a camera body 41 and an interchangeable lens 42 which are detachable with respect to each other. Each of the camera body 41 and the interchangeable lens 42 is provided with a bayonet-type mount (hereinafter, referred to as "bayonet mount" as appropriate or referred to simply as "mount"). A claw portion 53 is provided for a male bayonet mount 52 of the interchangeable lens 42 to protrude therefrom. An insertion portion 54 into which the claw portion 53 of the male bayonet mount 52 is inserted and an engaging portion 55 with which the claw portion 53 is engaged are provided for a female bayonet mount 51 of the camera body 41. An engaging mechanism (not shown), which uses an elastic member etc., is provided for one of or both of the claw portion 53 and the engaging portion 55.

In order to attach the interchangeable lens 42 to the camera body 41, the claw portion 53 of the male bayonet mount 52 is inserted into the insertion portion 54 of the female bayonet mount 51; a contact surface 56 of the male bayonet mount 52 is brought in contact with a receiving surface 57 of the female bayonet mount 51; and the interchangeable lens 42 is rotated with respect to the camera body 41. In this situation, the contact surface 56 and the receiving surface 57 slidably move with respect to each other in a state that the contact surface 56 and the receiving surface 57 make contact with each other. Then, the interchangeable lens 42 is further rotated to engage the claw portion 53 of the male bayonet mount 52 with the engaging portion 55 of the female bayonet mount 51, and the attachment of the interchangeable lens 42 is completed. In this situation, a surface of the claw portion 53 and a surface of the engaging portion 55 slidably move with each other while making contact with each other. Further, in a case that the interchangeable lens 42 is detached or removed from the camera body 41, the processes described above are performed in a reversed order. Therefore, the female bayonet mount 51 of the camera body 41 and the male bayonet mount 52 of the interchangeable lens 42 slidably move with respect to each other in a state that they make contact with each other every time when the interchangeable lens 42 is exchanged.

In the female bayonet mount 51 and the male bayonet mount 52, the stacked bodies of the composite plastic member as described above are formed on the surfaces of the substrates 101 having the shapes of the bayonet mounts 51, 52, respectively. According to this embodiment, there is also provided the camera body and/or the lens unit provided with the bayonet mounts described above. Note that the mount member disposed on the side of the lens unit and/or the mount member disposed on the side of the camera body are not limited to the bayonet-type, but may be a screw-in type or threaded type.

EXAMPLES

Hereinbelow, the composite plastic member and the method for producing the same will be described. However, aspects of the composite plastic member and the method for producing the same are not limited to the examples described below.

Example 1

In Example 1, as shown in FIG. 1, there was produced a composite plastic member 1000 having a stacked body 102, comprised of thirteen layers, and formed on a plastic substrate 101. Specifically, a lens mount made of polycarbonate (PC) was used as the plastic substrate 101 to produce a lens mount made of polycarbonate and having the stacked body as shown in FIG. 1 formed thereon.

Table 1 shows the composition of each of the layers forming the stacked body, the type of the film-forming method of each layer, the presence or absence of application of the bias voltage with respect to each layer, and the film thickness of each layer. In Table 1, a layer disposed directly on the substrate is the first layer, and a number assigned to each layer becomes larger in an ascending order starting from the layer disposed directly on the substrate. That is, the uppermost layer is the thirteenth layer.

TABLE 1

Structure of Layer

|  | Layer | Composition | Film-Forming Method | Bias | Thickness of Film |
|---|---|---|---|---|---|
| EXAMPLE 1 | Substrate | PC | — | — | — |
|  | 1 | Cr | FCVA | — | 40 nm |
|  | 2 | Cr | Sp | — | 125 nm |
|  | 3 | Cr | FCVA | — | 20 nm |
|  | 4 | Cr | Sp | — | 125 nm |
|  | 5 | Cr | FCVA | — | 20 nm |
|  | 6 | Cr | Sp | — | 125 nm |
|  | 7 | Cr | FCVA | — | 20 nm |
|  | 8 | CrNx | Sp | — | 125 nm |
|  | 9 | CrNx | FCVA | — | 20 nm |
|  | 10 | CrNx | Sp | −150 V | 125 nm |
|  | 11 | CrNx | FCVA | −150 V | 20 nm |
|  | 12 | CrNx | Sp | −150 V | 125 nm |
|  | 13 | CrNx | FCVA | −150 V | 54 nm |

The stacked body is formed by alternately stacking the layer formed by the FCVA and the layer formed by the sputtering. Then, as shown in FIG. 1, the first to seventh layers are the chromium layers 201, 202 formed without applying the bias voltage; the eighth and ninth layers are the chromium nitride layers 203, 204 formed without applying the bias voltage; and the tenth to thirteenth layers are the chromium nitride layers 205, 206 formed while applying the bias voltage. That is, the stacked body is formed of six kinds of layers described below classified by the chemical compositions and the film-forming methods.

Chromium Layer (high-hardness chromium layer) 201 formed by the FCVA without applying the bias voltage (the first layer, the third layer, the fifth layer, and the seventh layer);

Chromium Layer (low-hardness chromium layer) 202 formed by the sputtering without applying the bias voltage (the second layer, the fourth layer, and the sixth layer);

Chromium nitride layer (high-hardness chromium nitride layer) 204 formed by the FCVA without applying the bias voltage (the ninth layer);

Chromium nitride layer (low-hardness chromium nitride layer) 203 formed by the sputtering without applying the bias voltage (the eighth layer);

Chromium nitride layer (high-hardness chromium nitride layer) 206 formed by the FCVA while applying the bias voltage (the eleventh layer and thirteenth layer);

Chromium nitride layer (low-hardness chromium nitride layer) 205 formed by the sputtering while applying the bias voltage (the tenth layer and the twelfth layer);

In this example, the stacked body 102 of the composite plastic member as shown in FIG. 1 was formed on the plastic substrate using the film-forming apparatus 100 as shown in FIG. 2 described above. That is, the FCVA method and the sputtering method to be described below were switched alternately by using the film-forming apparatus 100 to form each of the films on the substrate in an ascending order from the first layer to the thirteenth layer. As described above, the stacked body includes the six kinds of layers, and thus the stacked body was produced by combining six kinds of film-forming methods which form the six kinds of layers, respectively.

[Formation of First Layer]

The chromium layer as the first layer was formed on the plastic substrate using the film-forming apparatus 100 as shown in FIG. 2 by the FCVA without applying the bias voltage. The pressure in the film-forming chamber 15 of the film-forming apparatus 100 was reduced to be about $10^{-5}$ (Torr) by the unillustrated vacuum device. Operation conditions of the film-forming apparatus 100 were set as follows: Arc current of a vacuum arc power source (power source on a side of the cathode 1) in the arc plasma producing section 16 was 160 A; current (filter current) of the double-bend electromagnetic coil (not shown) in the electromagnetic filter 4 was 13 A; current (anode current) of the power source on a side of the anode in the arc plasma producing section 16 was 15 A; and voltage (duct voltage) of the FCVA beam scanning coil 5 was 0.5 to 1.0 V. The discharge was executed for 1500 seconds. Under the above film-forming conditions, the chromium layer was formed by the FCVA to form the chromium layer having a thickness of 40 nm on the plastic substrate.

[Formation of Second Layer]

The chromium layer as the second layer was formed by the sputtering without applying the bias voltage. The chromium layer having a thickness of 125 nm was formed on the first layer under the following conditions. That is, the argon gas was introduced into the film-forming chamber 15 from the unillustrated gas-introducing pipe at a flow rate of 250 sccm; the introduced electric power was 5 kW; and the sputtering was executed for about 1200 seconds.

[Formation of Third Layer to Seventh Layer]

The chromium layers were formed, as the third layer, the fifth layer, and the seventh layer, by the FCVA without applying the bias voltage. The chromium layers each having a thickness of 20 nm were formed respectively by forming the films under the same conditions as those of the first layer. The chromium layers were formed, as the fourth layer and the sixth layer, by the sputtering without applying the bias voltage. With respect to the fourth layer and the sixth layer, the chromium layers each having a thickness of 125 nm were obtained under the same conditions as those of the second layer.

[Formation of Eighth Layer]

The chromium nitride layer was formed, as the eighth layer, by the sputtering without applying the bias voltage. The eighth layer was formed while introducing the nitrogen gas into the film-forming chamber 15 from the gas-introducing pipe by a method to be described next. At first, the nitrogen gas was introduced into the film-forming chamber 15 for 10 seconds at a flow rate of 20 sccm; next, the flow rate was changed to 40 sccm to introduce the nitrogen gas into the film-forming chamber 15 for 10 seconds. Then, as described above, the flow rate of the nitrogen gas was repeatedly changed every 10 seconds. Other than the introduction of the nitrogen gas, the chromium nitride layer having the thickness of 125 nm was formed on the seventh layer in a similar manner as that of the second layer. By changing the flow rate of the nitrogen gas periodically as described above, the nitrogen-content amount in the chromium nitride layer to be formed is varied and extremely thin chromium nitride films having different nitrogen-content amounts are formed in an interior of one layer with each interface intervening therebetween. Accordingly, the number of the interfaces of the extremely thin films increases innumerably and each of the extremely thin films is exfoliated from each of the interfaces gradually due to the slidable movement. Thus, it is possible to lengthen a time elapsed until the entire stacked body is completely exfoliated to expose the substrate. That is, improvement in the durability with respect to the attachment and detachment can be expected.

[Formation of Ninth Layer]

The chromium nitride layer was formed, as the ninth layer, by the FCVA without applying the bias voltage. The ninth layer was formed in a state that the nitrogen gas was introduced into the film-forming chamber 15 while changing the flow rate of the nitrogen gas in a similar manner as that of the eighth layer. At first, the nitrogen gas was introduced into the film-forming chamber 15 for 10 seconds at a flow rate of 30 sccm; next, the flow rate was changed to 60 sccm to introduce the nitrogen gas into the film-forming chamber 15 for 10 seconds. Then, as described above, the flow rate of the nitrogen gas was repeatedly changed every 10 seconds. Other than the introduction of the nitrogen gas, the chromium nitride layer having the thickness of 20 nm was formed on the eighth layer under the same conditions as those of the first layer.

[Formation of Tenth Layer]

The chromium nitride layer was formed, as the tenth layer, by the sputtering while applying the bias voltage. Other than that a direct-current bias voltage of −150 V was applied at the time of sputtering, the chromium nitride layer having the film thickness of 125 nm was formed on the ninth layer under the same conditions as those of the eighth layer.

[Formation of Eleventh Layer]

The chromium nitride layer was formed, as the eleventh layer, by the FCVA while applying the bias voltage. Other than that the bias voltage of −150 V was applied with a pulse frequency 1500 Hz, the chromium nitride layer having the thickness of 20 nm was formed on the tenth layer under the same conditions as those of the ninth layer.

[Formation of Twelfth Layer and Thirteenth Layer]

The chromium nitride layer was formed, as the twelfth layer, by the sputtering while applying the bias voltage. The chromium nitride layer having the thickness of 125 nm was formed on the eleventh layer under the same conditions as those of the tenth layer. The chromium nitride layer was formed, as the thirteenth layer, by the FCVA while applying the bias voltage. The chromium nitride layer having a thickness of 54 nm was formed on the twelfth layer under the same conditions as those of the eleventh layer.

Accordingly, the composite plastic member as the lens mount was obtained. The lens mount was glossy and had an excellent exterior appearance. The total of thicknesses of the respective films of the stacked body was 944 nm. With respect to the composite plastic member of this example, four kinds of tests including an initial adhesion test, a high-temperature and high-humidity test, a thermal shock test, and an attachment and detachment test were carried out, and each of the characteristics of the composite plastic member of this example was evaluated. In the following, an explanation will be made about each of the test methods.

[Initial Adhesion Test]

An adhesive tape was reliably and frictionally pressure-adhered or bonded to a surface (film-formation surface) for which the film was formed (uppermost layer of the stacked body) of the composite plastic member of this example. After the adhesive tape was frictionally pressure-adhered, the adhesive tape was separated (removed) from the film-formation surface. The film-formation surface after the adhesive tape was separated was visually observed to confirm whether or not any float and exfoliation of the multilayer film were present. In a case that the float and exfoliation of the formed multilayer film were not occurred, it was judged that the multilayer film passed the test.

[High-Temperature and High-Humidity Test]

The composite plastic member of this example was placed in a constant-temperature and constant-humidity chamber to be left there for a predetermined period of time under predetermined different high-temperature and high-humidity conditions 1 and 2. In this situation, the composite plastic member was arranged in the chamber in a state that a test surface (uppermost surface of the stacked body), to be subjected to the test as will be described later on, was oriented or turned upwardly.

After the predetermined period of time was elapsed, the composite plastic member was taken out of the constant-temperature and constant-humidity chamber and was left in a room (ordinary temperature and ordinary humidity). After the composite plastic member was left under the room temperature, a test which was same as the initial adhesion test as described above was executed. In a case that any float and exfoliation were not occurred in the formed multilayer film, it was judged that the multilayer film passed the test.

[Thermal Shock Test]

The composite plastic member of this example was placed in a thermal shock testing machine; was left in the machine for a predetermined period of time under a high temperature condition and then left in the machine for a predetermined period of time under a low temperature condition. This was regarded as one cycle and this one cycle was continuously executed in a predetermined number of cycles. In this situation, the composite plastic member was arranged in the chamber in a state that the test surface thereof was oriented or turned upward.

The composite plastic member was taken out of the thermal shock testing machine and was left in the room (ordinary temperature and ordinary humidity) for a predetermined period of time. After the composite plastic member was left under the room temperature, a test which was same as the initial adhesion test as described above was executed. In a case that any float and exfoliation were not occurred in the formed multilayer film, it was judged that the multilayer film passed the test.

[Attachment and Detachment Test]

The composite plastic member, as the lens mount, produced in this example was attached to and removed from the mount on the side of the camera body as a mating component slidably movable relative to and connectable to the composite plastic member. The mount on the side of the camera body was formed by plating a brass substrate with chromium. The attachment and detachment as described above was counted as one time, and was continuously performed for a predetermined number of times. After the attachment and detachment with respect to the mating component was repeated for the predetermined number of times, the presence or absence of exposure of the plastic substrate which was the back layer or base layer of the stacked body was confirmed. The test result was indicated as the achievement rate with respect to the predetermined target number of times (same as the all test samples).

Table 2 shows the evaluation result of the composite plastic member of this example. According to the initial adhesion test executed with respect to 285 composite plastic member samples, all of the 285 samples passed the test. According to the high-temperature and high-humidity test executed with respect to 85 samples under the conditions 1 and 2 respectively, all of the 85 samples passed the test. According to the thermal shock test executed with respect to 85 samples, all of the 85 samples passed the test. Further, according to the attachment and detachment test in which the attachment and detachment was executed for the predetermined target number of times, the exposure of the substrate was not confirmed.

TABLE 2

| Initial Adhesion Test (The number of samples which passed the test/the number of samples) | High-Temperature and High-Humidity Test (The number of samples which passed the test/ the number of samples) | | Thermal Shock Test (The number of samples which passed the test/the number of samples) | Attachment and detachment Test |
|---|---|---|---|---|
| | Condition 1 | Condition 2 | | |
| 285/285 | 85/85 | 85/85 | 85/85 | After executing attaching/ detaching for target number of times, substrate was not exposed |

[Evaluation of Each Layer Forming Composite Plastic Member]

Next, in order to evaluate six kinds of layer structures of the first layer, the second layer, and the eighth to eleventh layers forming the composite plastic member of this example, each of the layers was formed individually on the silicon substrate to produce an evaluation sample having a thickness of 100 nm. The microstructure of each of the layers was observed with a scanning electron microscope (hereinafter abbreviated as "SEM"); and further, the chemical composition analysis, measurement of elastic modulus and measurement of hardness were performed with respect to each of the layers. Each of the results will be explained below.

[SEM Observation]

Figure 5:
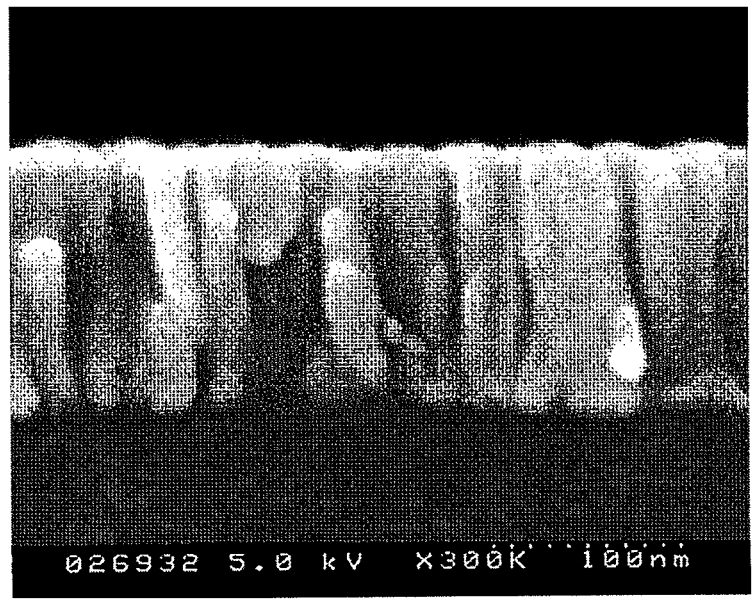
FIG. 5 shows a scanning type electron micrograph of a cross section of a chromium layer which was formed by sputtering without applying the bias voltage.
Figure 6:
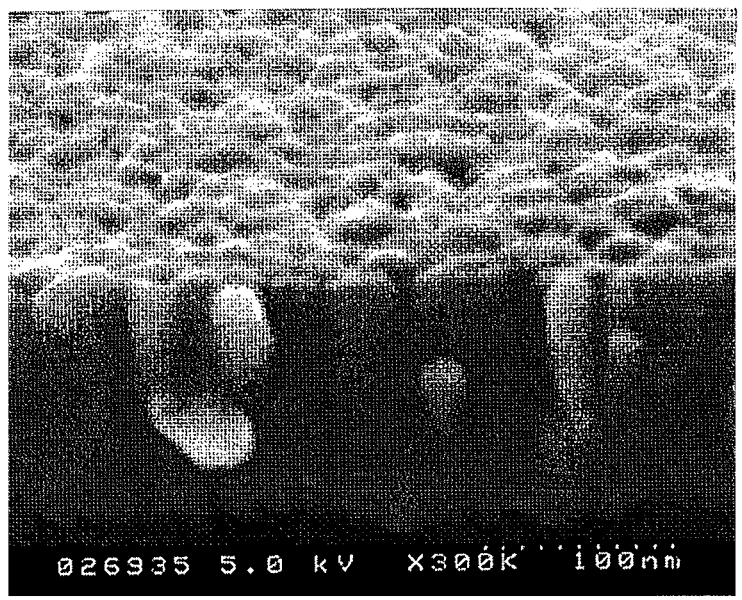
FIG. 6 shows a scanning type electron micrograph of a surface of the chromium layer which was formed by the sputtering without applying the bias voltage.

With respect to each of the produced samples, SEM observation was performed for a cross section and a surface of each of the layers. As shown in FIGS. 3 and 4, the first layer, which was the chromium layer formed by the FCVA without applying the bias voltage, had a small number of voids and was dense; had an isotropic structure; and had a relatively smooth or planar surface. On the other hand, as shown in FIGS. 5 and 6, the second layer, which was the chromium layer formed by the sputtering without applying the bias voltage, had a large number of voids, an anisotropic columnar structure (width: 15 nm to 30 nm) extending in the direction of thickness (thickness direction), and a surface rougher than that of the chromium layer formed by the FCVA.

Figure 7:
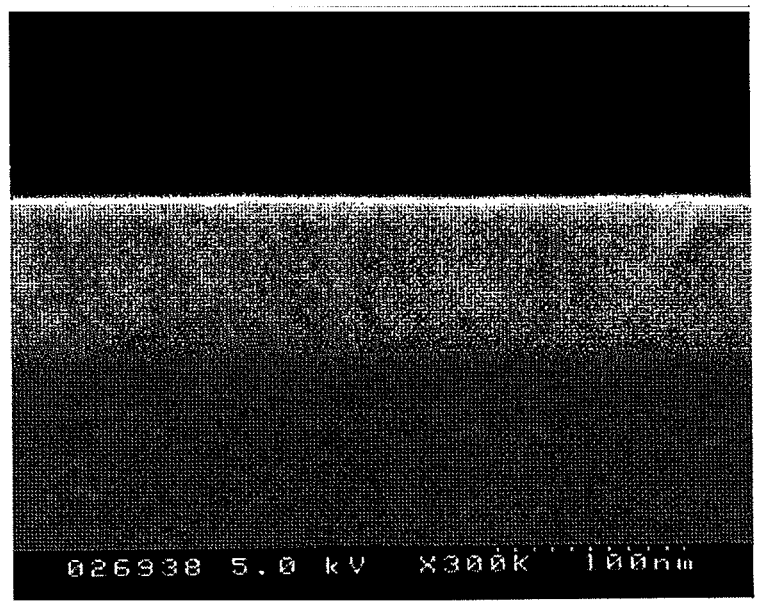
FIG. 7 shows a scanning type electron micrograph of a cross section of a chromium nitride layer which was formed by the FCVA without applying the bias voltage.
Figure 8:
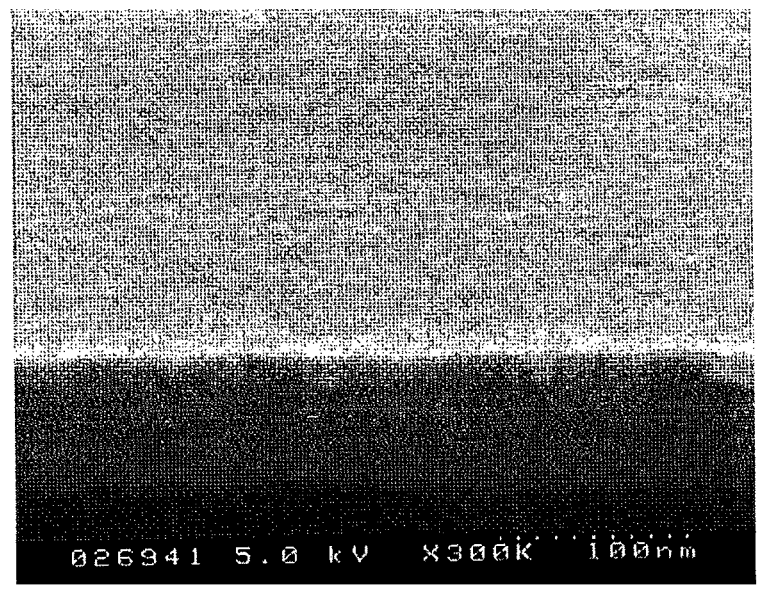
FIG. 8 shows a scanning type electron micrograph of a surface of the chromium nitride layer which was formed by the FCVA without applying the bias voltage.

As shown in FIGS. 7 and 8, the ninth layer, which was the chromium nitride layer formed by the FCVA without applying the bias voltage, had a small number of voids and was dense; had an isotropic structure; and had a relatively smooth or planar surface. On the other hand, as shown in FIGS. 9 and 10, the eighth layer, which was the chromium nitride layer formed by the sputtering without applying the bias voltage, had a large number of voids, an anisotropic columnar structure (width: 15 nm to 20 nm) extending in the thickness direction, and a surface rougher than that of the chromium nitride layer formed by the FCVA.

Figure 11:
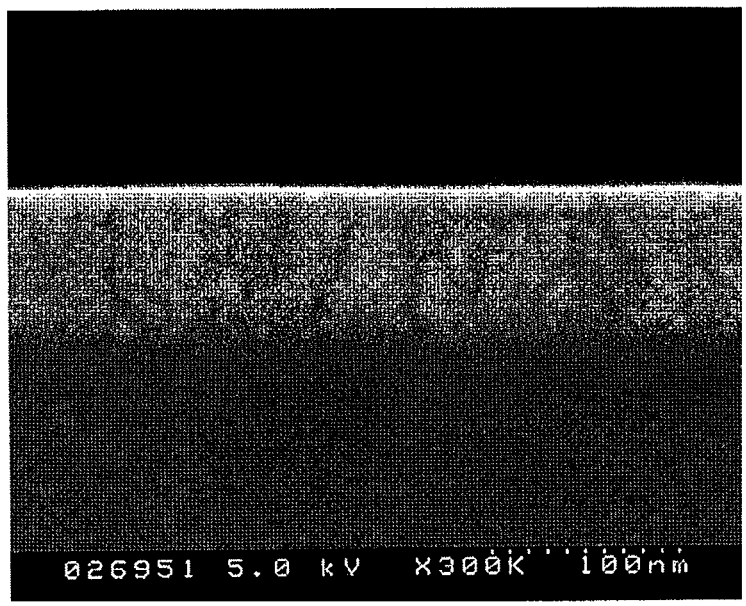
FIG. 11 shows a scanning type electron micrograph of a cross section of a chromium nitride layer which was formed by the FCVA while applying the bias voltage.
Figure 12:
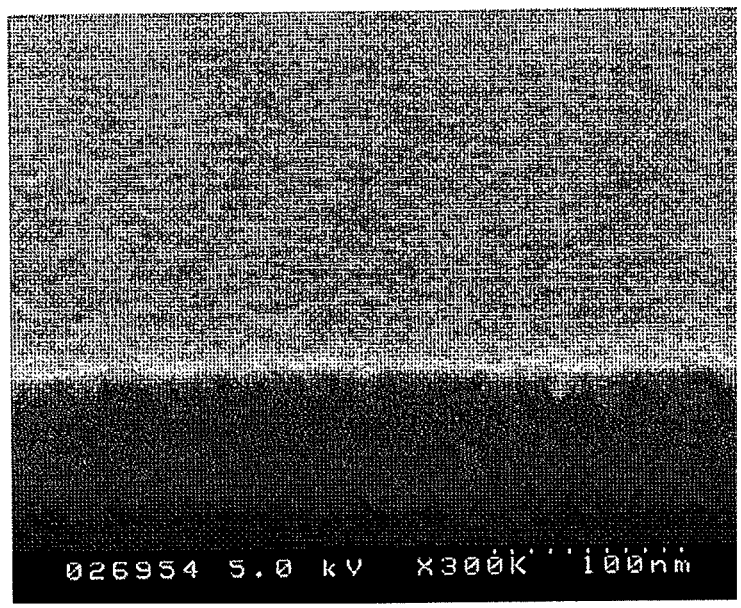
FIG. 12 shows a scanning type electron micrograph of a surface of the chromium nitride layer which was formed by the FCVA while applying the bias voltage.

As shown in FIGS. 11 and 12, the eleventh layer, which was the chromium nitride layer formed by the FCVA while applying the bias voltage, had a small number of voids and was dense; had an isotropic structure; and had a relatively smooth or planar surface. On the other hand, as shown in FIGS. 13 and 14, the tenth layer, which was the chromium nitride layer formed by the sputtering while applying the bias voltage, had a large number of voids, an anisotropic columnar structure extending in the film thickness direction, and a rough surface.

Figure 3:
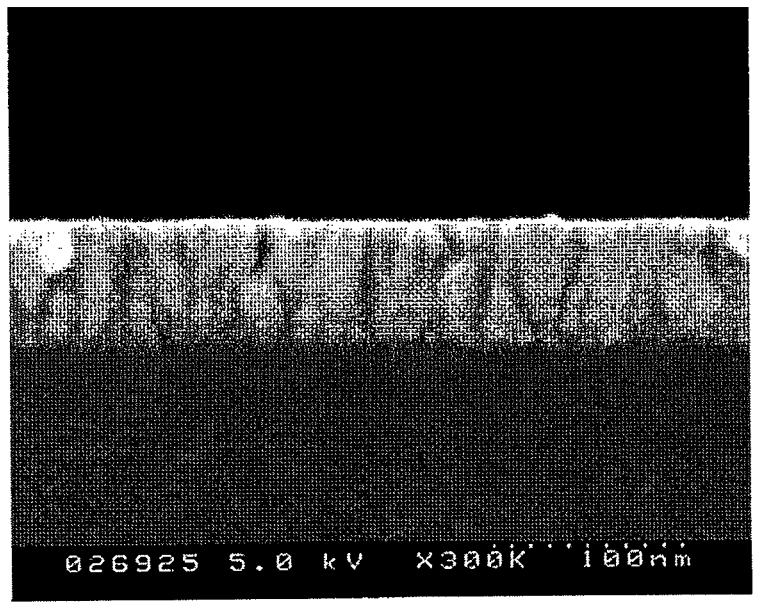
FIG. 3 shows a scanning type electron micrograph of a cross section of a chromium layer which was formed by FCVA without applying a bias voltage.
Figure 4:
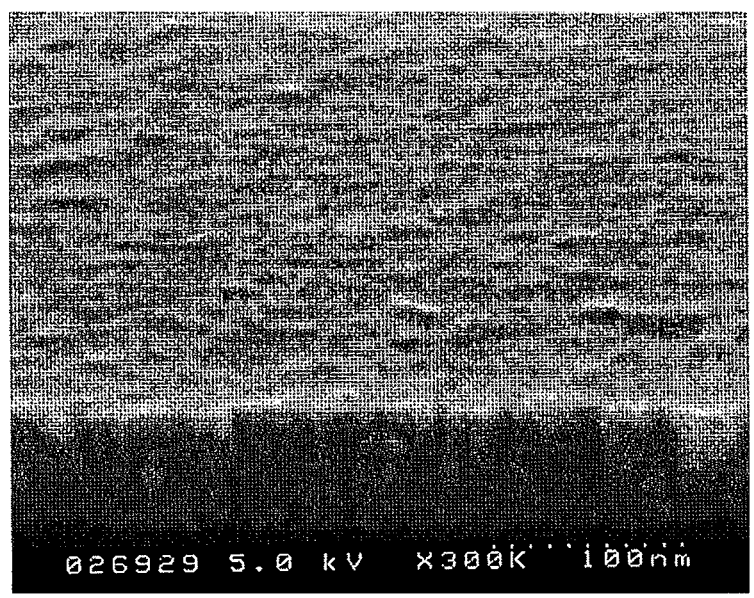
FIG. 4 shows a scanning type electron micrograph of a surface of the chromium layer which was formed by the FCVA without applying the bias voltage.

Further, with respect to the layers formed by the FCVA, it has been found out, from the comparisons among the chromium layers shown in FIGS. 3 and 4, the chromium nitride layers shown in FIGS. 7 and 8, and the chromium nitride layers shown in FIGS. 11 and 12, that each of the chromium nitride layers was denser and had a smaller number of voids and the smoother surface than each of the chromium layers. On the other hand, it has been found out, from the comparison between the chromium nitride layers as shown in FIGS. 7 and 8 formed without applying the bias voltage and the chromium nitride layers as shown in FIGS. 11 and 12 formed while applying the bias voltage, that there was hardly caused great difference in the microstructures of the chromium nitride layers formed by the FCVA depending on the presence or absence of the bias voltage.

Figure 9:
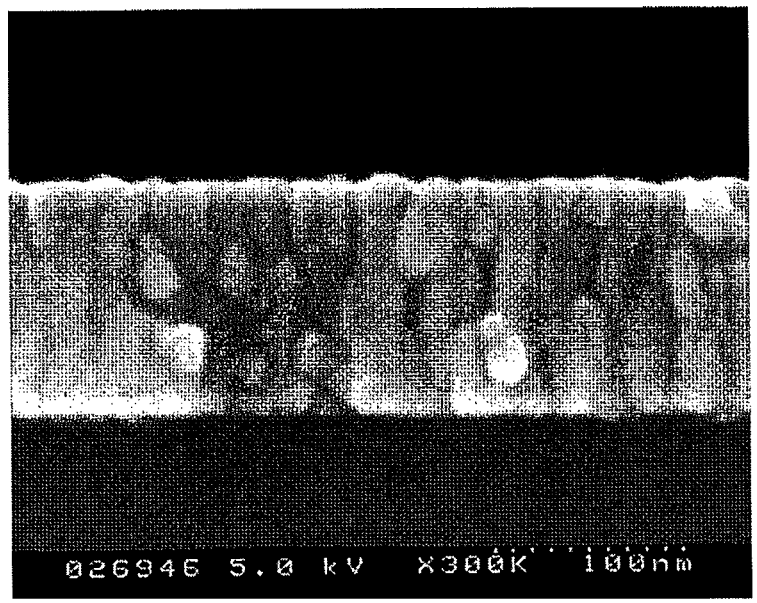
FIG. 9 shows a scanning type electron micrograph of a cross section of a chromium nitride layer which was formed by the sputtering without applying the bias voltage.
Figure 10:
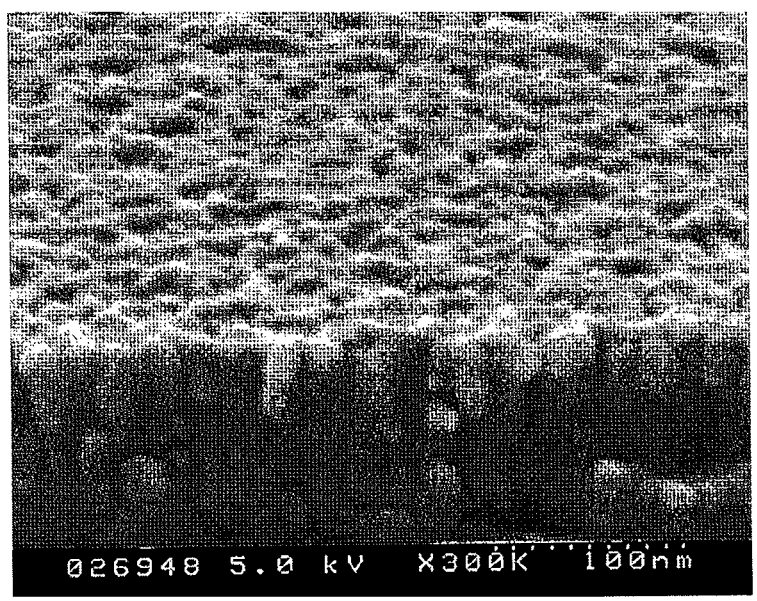
FIG. 10 shows a scanning type electron micrograph of a surface of the chromium nitride layer which was formed by the sputtering without applying the bias voltage.
Figure 13:
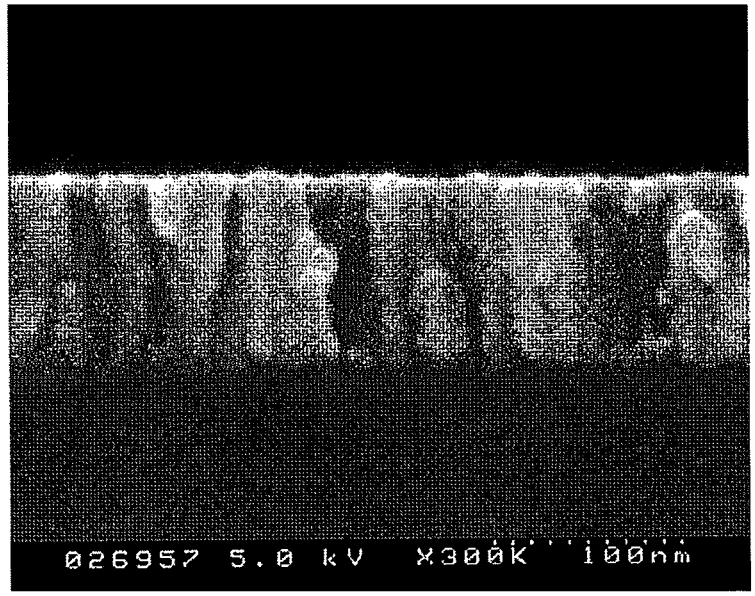
FIG. 13 shows a scanning type electron micrograph of a cross section of a chromium nitride layer which is formed by the sputtering while applying the bias voltage.
Figure 14:
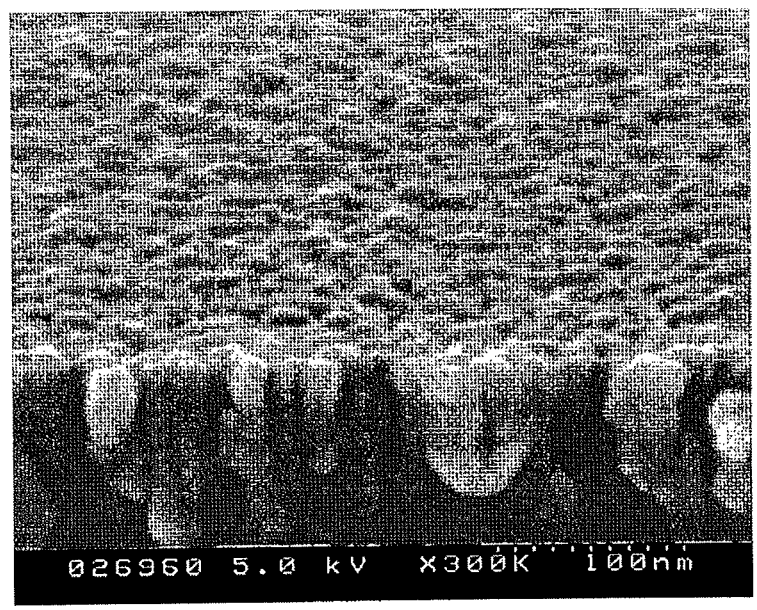
FIG. 14 shows a scanning type electron micrograph of a surface of the chromium nitride layer which is formed by the sputtering while applying the bias voltage.

With respect to the layers formed by the sputtering, it has been found out, from the comparisons among the chromium layers shown in FIGS. 5 and 6, the chromium nitride layers shown in FIGS. 9 and 10, and the chromium nitride layers shown in FIGS. 13 and 14, that each of the chromium nitride layers had a denser columnar structure therein, a smaller number of voids, and a surface having a smaller degree of irregularity (roughness) than each of the chromium layers. Further, it has been found out that, from the comparison between the chromium nitride layers as shown in FIGS. 9 and 10 formed without applying the bias voltage and the chromium nitride layers as shown in FIGS. 13 and 14 formed while applying the bias voltage, in the chromium nitride layers formed by the sputtering, the columnar structure became finer and more minute, the number of voids was decreased and the irregularity (roughness) of the surface of each layer was smaller by the application of the bias voltage.

[Chemical Composition of Each Layer]

The chemical compositions of the respective layers of each of the produced samples were evaluated by the Rutherford backscattering spectrometry method. A result of the chemical composition of each of the layers is shown in Table 3.

TABLE 3

| | Type of Layer | N/Cr atomic ratio |
|---|---|---|
| 1st Layer | Chromium Layer by FCVA Bias Voltage was not applied | 0 |
| 2nd Layer | Chromium Layer by Sputtering Bias Voltage was not applied | 0 |
| 9th Layer | Chromium Nitride Layer by FCVA Bias Voltage was not applied | 0.42 |
| 8th Layer | Chromium Nitride Layer by Sputtering Bias Voltage was not applied | 0.26 |
| 11th Layer | Chromium Nitride Layer by FCVA Bias Voltage was applied | 0.42 |
| 10th Layer | Chromium Nitride Layer by Sputtering Bias Voltage was applied | 0.26 |

[Evaluations of Elastic Modulus and Hardness of Each Layer]

The elastic modulus and the film hardness were measured by a nanoindentation method for each of the produced samples. Results of the measurements are shown in Table 4. Note that each of the results is an average value of the measured values and parenthesized numerical values are each a standard deviation.

TABLE 4

| | Type of Layer | Elastic Modulus (GPa) | Hardness (GPa) |
|---|---|---|---|
| 1st Layer | Chromium Layer by FCVA Bias Voltage was not applied | 206.7 (5.9) | 14.5 (0.5) |
| 2nd Layer | Chromium Layer by Sputtering Bias Voltage was not applied | 164.5 (14.9) | 9.9 (0.9) |
| 9th Layer | Chromium Nitride Layer by FCVA Bias Voltage was not applied | 234.1 (9.3) | 21.7 (1.3) |
| 8th Layer | Chromium Nitride Layer by Sputtering Bias Voltage was not applied | 207.8 (13.5) | 13.5 (1.2) |
| 11th Layer | Chromium Nitride Layer by FCVA Bias Voltage was applied | 226.4 (5.5) | 19.9 (0.6) |
| 10th Layer | Chromium Nitride Layer by Sputtering Bias Voltage was applied | 220.6 (11.9) | 15.1 (1.1) |

According to the measurement result of the hardness of each of the layers, the following facts have been found out: (1) irrespective of the film-forming methods, each of the chromium nitride layers is harder than each of the chromium layers; (2) each of the chromium layers formed by the FCVA is harder than each of the chromium layers formed by the sputtering; (3) each of the chromium nitride layers formed by the FCVA is harder than each of the chromium nitride layers formed by the sputtering; (4) with respect to each of the chromium nitride layers formed by the FCVA, the hardness of the film is hardly influenced by the presence or absence of application of the bias voltage; and (5) with respect to each of the chromium nitride layers formed by the sputtering, the layer formed by applying the bias voltage is harder than the layer formed without applying the bias voltage. In this example, the following facts have been found out. That is, the difference of hardness between the chromium layers which contact with each other from above and below is not less than 40%; and the difference of hardness between the chromium nitride layers which contact with each other from above and below is not less than 60% in a case that these chromium nitride layers were formed without applying the bias voltage, and the difference of hardness between the chromium nitride layers which contact with each other from above and below is not less than 30% in a case that the these chromium nitride layers were formed by applying the bias voltage.

Figure 17:
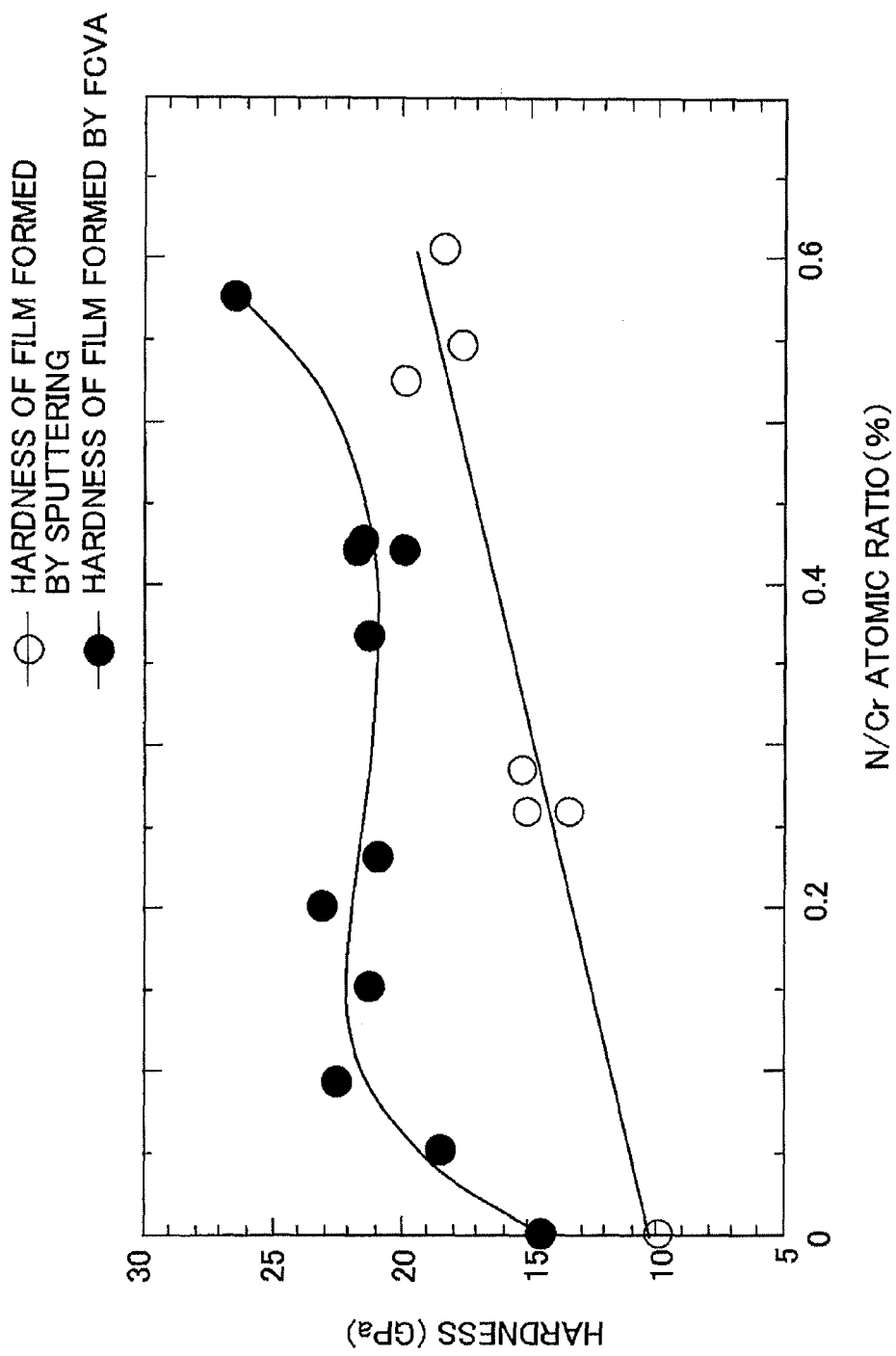
FIG. 17 is a graph showing a change in hardness with respect to N/Cr atomic ratio of each of the chromium nitride layers formed by the sputtering and the FCVA.

Further, with respect to the chromium nitride layers formed by the sputtering and the FCVA, the change in hardness of each of the chromium nitride layers in relation to the nitrogen-content amount in each of the chromium nitride layers was measured based on the results of Tables 3 and 4. The chromium nitride layers having various nitrogen-content amounts were formed by changing the introduction amount of nitrogen in both of the sputtering and the FCVA methods. The respective measurement results are shown in a graph of FIG. 17 in which the nitrogen-content amount is expressed as the N/Cr atomic ratio. According to the graph of FIG. 17, the hardness of each of the chromium nitride layers formed by any of the sputtering and the FCVA methods changes depending on the nitrogen-content amount. From the viewpoint of the stability (production stability) of the hardness with respect to change in the nitrogen-content amount, the following facts have been found out. That is, the hardness is approximately constant (21 GPa to 24 GPa) within a range of the N/Cr atomic ratio 0.1 to 0.5 in the chromium nitride layers formed by the FCVA; and the hardness is not changed greatly within the range of the N/Cr atomic ratio described above even when the N/Cr atomic ratio is more or less changed due to change(s) in the production condition and/or the atmosphere. On the other hand, the hardness is generally more likely to be increased in the chromium nitride layers formed by the sputtering with an increase in the nitrogen-content amount.

Example 2

In Example 2, there was produced a composite plastic member which has a stacked body comprised of thirteen layers and formed on a plastic substrate. Similar to Example 1, a lens mount made of polycarbonate (PC) was used as the plastic substrate. Table 5 shows composition of each layer forming the stacked body of this example, the type of the film-forming method of each layer, the presence or absence of application of the bias voltage with respect to each layer, and the film thickness of each layer. In Table 5, a layer disposed directly on the substrate is the first layer, and a number assigned to each layer becomes larger in an ascending order starting from the layer disposed directly on the substrate. That is, the uppermost layer is the thirteenth layer. The total of the thicknesses of the respective films of the stacked body was 494 nm.

TABLE 5

| | | Structure of Layer | | | |
|---|---|---|---|---|---|
| | Layer | Composition | Film-Forming Method | Bias | Thickness of Film |
| EXAMPLE 2 | Substrate | PC | — | — | — |
| | 1 | Cr | FCVA | — | 40 nm |
| | 2 | Cr | Sp | — | 50 nm |
| | 3 | Cr | FCVA | — | 20 nm |
| | 4 | Cr | Sp | — | 50 nm |
| | 5 | Cr | FCVA | — | 20 nm |
| | 6 | Cr | Sp | — | 50 nm |
| | 7 | Cr | FCVA | — | 20 nm |
| | 8 | CrNx | Sp | — | 50 nm |
| | 9 | CrNx | FCVA | — | 20 nm |
| | 10 | CrNx | Sp | −150 V | 50 nm |
| | 11 | CrNx | FCVA | −150 V | 20 nm |
| | 12 | CrNx | Sp | −150 V | 50 nm |
| | 13 | CrNx | FCVA | −150 V | 54 nm |

In Example 2, the chromium layers and the chromium nitride layers, formed by the sputtering, each having the thickness of 125 nm in Example 1 were each configured to have the thickness of 50 nm. Specifically, the second layer, the fourth layer, the sixth layer, the eighth layer, the tenth layer, and the twelfth layer were each configured to have the thickness of 50 nm. The total of the thicknesses of the respective films in Example 2 was made to be thinner than that in Example 1 by approximately 48%. Other than this, the structure in Example 2 was same as that in Example 1; and the composite plastic member was produced under the same conditions as those in Example 1.

With respect to the composite plastic member of this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 6 shows the evaluation result of the composite plastic member of this example. According to the initial adhesion test executed with respect to 15 samples, all of the 15 samples passed the test. According to the high-temperature and high-humidity test executed with respect to 5 samples under the conditions 1 and 2 respectively, all of the 5 samples passed the test. According to the thermal shock test executed with respect to 5 samples, all of the 5 samples passed the test. Further, according to the attachment and detachment test in which the attachment and detachment was executed for the predetermined target number of times, the exposure of the substrate was not confirmed.

TABLE 6

| Initial Adhesion Test (The number of samples which passed the test/the number of samples) | High-Temperature and High-Humidity Test (The number of samples which passed the test/the number of samples) | | Thermal Shock Test (The number of samples which passed the test/the number of samples) | Attachment and detachment Test |
|---|---|---|---|---|
| | Condition 1 | Condition 2 | | |
| 15/15 | 5/5 | 5/5 | 5/5 | After executing attaching/detaching for target number of times, Substrate was not exposed |

Example 3

In Example 3, there was produced a composite plastic member which has a stacked body comprised of thirteen layers and formed on a plastic substrate. As the plastic substrate, a lens mount made of polycarbonate (PC) which was same as that used in Example 1 was used. Table 7 shows the composition of each of the layers forming the stacked body of this example, the type of the film-forming method of each layer, the presence or absence of application of the bias voltage with respect to each layer, and the film thickness of each layer. In Table 7, a layer disposed directly on the substrate is the first layer, and a number assigned to each layer becomes larger in an ascending order starting from the layer disposed directly on the substrate. That is, the uppermost layer is the thirteenth layer. The total of the thicknesses of the respective films of the stacked body was 644 nm.

TABLE 7

| | Layer | Composition | Film-Forming Method | Bias | Thickness of Film |
|---|---|---|---|---|---|
| EXAMPLE 3 | Substrate | PC | — | — | — |
| | 1 | Cr | FCVA | — | 40 nm |
| | 2 | Cr | Sp | — | 75 nm |
| | 3 | Cr | FCVA | — | 20 nm |

TABLE 7-continued

| | Structure of Layer | | | |
|---|---|---|---|---|
| Layer | Composition | Film-Forming Method | Bias | Thickness of Film |
| 4 | Cr | Sp | — | 75 nm |
| 5 | Cr | FCVA | — | 20 nm |
| 6 | Cr | Sp | — | 75 nm |
| 7 | Cr | FCVA | — | 20 nm |
| 8 | CrNx | Sp | — | 75 nm |
| 9 | CrNx | FCVA | — | 20 nm |
| 10 | CrNx | Sp | −150 V | 75 nm |
| 11 | CrNx | FCVA | −150 V | 20 nm |
| 12 | CrNx | Sp | −150 V | 75 nm |
| 13 | CrNx | FCVA | −150 V | 54 nm |

In Example 3, the chromium layers and the chromium nitride layers, formed by the sputtering, each having the thickness of 125 nm in Example 1 were each configured to have the thickness of 75 nm. Specifically, the second layer, the fourth layer, the sixth layer, the eighth layer, the tenth layer, and the twelfth layer were each configured to have the thickness of 75 nm. The total of the thicknesses of the respective films in Example 3 was made to be thinner than that in Example 1 by approximately 32%. Other than this, the structure in Example 3 was same as that in Example 1; and the composite plastic member was produced in a similar manner to that in Example 1.

With respect to the composite plastic member of this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 8 shows the evaluation result of the composite plastic member of this example. According to the initial adhesion test executed with respect to 15 samples, all of the 15 samples passed the test. According to the high-temperature and high-humidity test executed with respect to 5 samples under the conditions 1 and 2 as described above, all of the 5 samples passed the test. According to the thermal shock test executed with respect to 5 samples, all of the 5 samples passed the test. Further, according to the attachment and detachment test in which the attachment and detachment was executed for the predetermined target number of times, the exposure of the substrate was not confirmed.

TABLE 8

| Initial Adhesion Test (The number of samples which passed the test/the number of samples) | High-Temperature and High-Humidity Test (The number of samples which passed the test/the number of samples) | | Thermal Shock Test (The number of samples which passed the test/the number of samples) | Attachment and detachment Test |
|---|---|---|---|---|
| | Condition 1 | Condition 2 | | |
| 15/15 | 5/5 | 5/5 | 5/5 | After executing attaching/detaching for target number of times, Substrate was not exposed |

Example 4

In Example 4, there was produced a composite plastic member which has a stacked body comprised of seventeen layers and formed on a plastic substrate. As the plastic substrate, a lens mount made of polycarbonate (PC) which was same as that used in Example 1 was used; Table 9 shows the composition of each of the layers forming the stacked body of this example, the type of the film-forming method of each layer, the presence or absence of application of the bias voltage with respect to each layer, and the film thickness of each layer. In Table 9, a layer disposed directly on the substrate is the first layer, and a number assigned to each layer becomes larger in an ascending order starting from the layer disposed directly on the substrate. That is, the uppermost layer is the seventeenth layer. The total of the thicknesses of the respective films of the stacked body was 1234 nm.

TABLE 9

|  | | Structure of Layer | | |
|---|---|---|---|---|
|  | Layer | Composition | Film-Forming Method | Bias | Thickness of Film |
| EXAMPLE 4 | Substrate | PC | — | — | — |
|  | 1 | Cr | FCVA | — | 40 nm |
|  | 2 | Cr | Sp | — | 125 nm |
|  | 3 | Cr | FCVA | — | 20 nm |
|  | 4 | Cr | Sp | — | 125 nm |
|  | 5 | Cr | FCVA | — | 20 nm |
|  | 6 | Cr | Sp | — | 125 nm |
|  | 7 | Cr | FCVA | — | 20 nm |
|  | 8 | CrNx | Sp | — | 125 nm |
|  | 9 | CrNx | FCVA | — | 20 nm |
|  | 10 | CrNx | Sp | — | 125 nm |
|  | 11 | CrNx | FCVA | — | 20 nm |
|  | 12 | CrNx | Sp | −150 V | 125 nm |
|  | 13 | CrNx | FCVA | −150 V | 20 nm |
|  | 14 | CrNx | Sp | −150 V | 125 nm |
|  | 15 | CrNx | FCVA | −150 V | 20 nm |
|  | 16 | CrNx | Sp | −150 V | 125 nm |
|  | 17 | CrNx | FCVA | −150 V | 54 nm |

The stacked body of Example 4 was formed to have the total of the thicknesses of the respective films, which was thicker than that in Example 1 by approximately 31%, by further adding four layers to the thirteen layers of stacked body in Example 1. Specifically, layers, which were similar to the eighth and ninth layers of Example 1, were additionally stacked, as additional two layers, between the ninth and tenth layers in Example 1 under the same conditions as those in Example 1; and further, layers, which were similar to the tenth and eleventh layers of Example 1, were additionally stacked, as additional two layers, between the eleventh and twelfth layers in Example 1 under the same conditions as those in Example 1. Other than this, the structure in Example 4 was same as that in Example 1; and the composite plastic member was produced under the same conditions as those in Example 1.

With respect to the composite plastic member of this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 10 shows the evaluation result of the composite plastic member of this example. According to the initial adhesion test executed with respect to 15 samples, all of the 15 samples passed the test. According to the high-temperature and high-humidity test executed with respect to 5 samples under the conditions 1 and 2 respectively, all of the 5 samples passed the test. According to the thermal shock test executed with respect to 5 samples, all of the 5 samples passed the test. Further, according to the attachment and detachment test in which the attachment and detachment was executed for the predetermined target number of times, the exposure of the substrate was not confirmed.

TABLE 10

| Initial Adhesion Test (The number of samples which passed the test/the number of samples) | High-Temperature and High-Humidity Test (The number of samples which passed the test/the number of samples) | | Thermal Shock Test (The number of samples which passed the test/the number of samples) | Attachment and detachment Test |
|---|---|---|---|---|
|  | Condition 1 | Condition 2 |  |  |
| 15/15 | 5/5 | 5/5 | 5/5 | After executing attaching/detaching for target number of times, Substrate was not exposed |

Example 5

In Example 5, there was produced a composite plastic member which has a stacked body comprised of twenty-one layers and formed on a plastic substrate. As the plastic substrate, a lens mount made of polycarbonate (PC) was used. Table 11 shows the composition of each of the layers forming the stacked body of this example, the type of the film-forming method of each layer, the presence or absence of application of the bias voltage with respect to each layer, and the film thickness of each layer. In Table 11, a layer disposed directly on the substrate is the first layer, and a number assigned to each layer becomes larger in an ascending order starting from the layer directly on the substrate. That is, the uppermost layer is the twenty-first layer. The total of the thicknesses of the respective films of the stacked body was 1524 nm.

TABLE 11

|  | | Structure of Layer | | |
|---|---|---|---|---|
|  | Layer | Composition | Film-Forming Method | Bias | Thickness of Film |
| EXAMPLE 5 | Substrate | PC | — | — | — |
|  | 1 | Cr | FCVA | — | 40 nm |
|  | 2 | Cr | Sp | — | 125 nm |
|  | 3 | Cr | FCVA | — | 20 nm |
|  | 4 | Cr | Sp | — | 125 nm |
|  | 5 | Cr | FCVA | — | 20 nm |
|  | 6 | Cr | Sp | — | 125 nm |
|  | 7 | Cr | FCVA | — | 20 nm |
|  | 8 | Cr | Sp | — | 125 nm |
|  | 9 | Cr | FCVA | — | 20 nm |
|  | 10 | CrNx | Sp | — | 125 nm |
|  | 11 | CrNx | FCVA | — | 20 nm |
|  | 12 | CrNx | Sp | — | 125 nm |
|  | 13 | CrNx | FCVA | — | 20 nm |
|  | 14 | CrNx | Sp | −150 V | 125 nm |

TABLE 11-continued

| | | Structure of Layer | | |
|---|---|---|---|---|
| Layer | Composition | Film-Forming Method | Bias | Thickness of Film |
| 15 | CrNx | FCVA | −150 V | 20 nm |
| 16 | CrNx | Sp | −150 V | 125 nm |
| 17 | CrNx | FCVA | −150 V | 20 nm |
| 18 | CrNx | Sp | −150 V | 125 nm |
| 19 | CrNx | FCVA | −150 V | 20 nm |
| 20 | CrNx | Sp | −150 V | 125 nm |
| 21 | CrNx | FCVA | −150 V | 54 nm |

The stacked body of Example 5 was formed to have the total of the thicknesses of the respective films, which was thicker than that in Example 1 by approximately 62%, by further adding eight layers to the thirteen layers of stacked body in Example 1. Specifically, layers, which were similar to the sixth and seventh layers of Example 1, were additionally stacked, as additional two layers, between the seventh and eighth layers in Example 1 under the same conditions as those in Example 1; layers, which were similar to the eighth and ninth layers of Example 1, were additionally stacked, as additional two layers, between the ninth and tenth layers in Example 1 under the same conditions as those in Example 1; and further, layers, which were similar to the tenth and eleventh layers of Example 1, were additionally stacked repeatedly twice, as additional four layers, between the eleventh and twelfth layers in Example 1 under the same conditions as those in Example 1. Other than this, the layer structure in Example 5 was same as that in Example 1; and composite plastic members were produced under the same conditions as those in Example 1.

With respect to the samples of the composite plastic members produced in this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 12 shows the evaluation result of the composite plastic member of this example. According to the initial adhesion test executed with respect to 15 samples, all of the 15 samples passed the test. According to the high-temperature and high-humidity test executed with respect to 5 samples under the conditions 1 and 2 respectively, all of the 5 samples passed the test. According to the thermal shock test executed with respect to 5 samples, all of the 5 samples passed the test. Further, according to the attachment and detachment test in which the attachment and detachment was executed for the predetermined target number of times, the exposure of the substrate was not confirmed.

TABLE 12

| Initial Adhesion Test (The number of samples which passed the test/the number of samples) | High-Temperature and High-Humidity Test (The number of samples which passed the test/ the number of samples) | | Thermal Shock Test (The number of samples which passed the test/the number of samples) | Attachment and detachment Test |
|---|---|---|---|---|
| | Condition 1 | Condition 2 | | |
| 15/15 | 5/5 | 5/5 | 5/5 | After executing attaching/ detaching for target number of times, Substrate was not exposed |

Example 6

In this example, as described in Table 13 indicated below, a composite plastic member was produced in a similar manner as Example 1, except that the number of stacked layers and the thickness with respect to each chromium layer and each chromium nitride layer were changed. That is, in Example 1, after forming the chromium layer as the first layer by the FCVA, the chromium layer formed by the sputtering and the chromium layer formed by the FCVA were alternately stacked; and this alternate stacking was repeated three times (three cycles). On the other hand, the alternate stacking was repeated only two times in Example 6. The total of the thicknesses of the respective films of the stacked body was 1035 nm.

TABLE 13

| | | | Structure of Layer | | |
|---|---|---|---|---|---|
| | Layer | Composition | Film-Forming Method | Bias | Thickness of Film |
| EXAMPLE 6 | Substrate | PC | — | — | — |
| | 1 | Cr | FCVA | — | 40 nm |
| | 2 | Cr | Sp | — | 200 nm |
| | 3 | Cr | FCVA | — | 40 nm |
| | 4 | Cr | Sp | — | 200 nm |
| | 5 | Cr | FCVA | — | 40 nm |
| | 6 | CrNx | Sp | — | 120 nm |
| | 7 | CrNx | FCVA | — | 35 nm |
| | 8 | CrNx | Sp | −150 V | 120 nm |
| | 9 | CrNx | FCVA | −150 V | 35 nm |
| | 10 | CrNx | Sp | −150 V | 120 nm |
| | 11 | CrNx | FCVA | −150 V | 85 nm |

With respect to the composite plastic member produced in this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 14 shows the evaluation result of the composite plastic member of this example. According to the initial adhesion test executed with respect to 9 samples, all of the 9 samples passed the test. According to the high-temperature and high-humidity test executed with respect to 9 samples under the condition 2 as described above, all of the 9 samples passed the test. According to the thermal shock test executed with respect to 9 samples, all of the 9 samples passed the test.

Further, according to the attachment and detachment test in which the attachment and detachment was executed for the predetermined target number of times, the exposure of the substrate was not confirmed.

TABLE 14

| Initial Adhesion Test (The number of samples which passed the test/the number of samples) | High-Temperature and High-Humidity Test (The number of samples which passed the test/ the number of samples) Condition 2 | Thermal Shock Test (The number of samples which passed the test/the number of samples) | Attachment and detachment Test |
|---|---|---|---|
| 9/9 | 9/9 | 9/9 | After executing attaching/detaching for target number of times, Substrate was not exposed |

Example 7

In this example, as described in Table 15 indicated below, a composite plastic member was produced in a similar manner as Example 1, except that the number of stacked layers and the thickness with respect to each chromium layer and each chromium nitride layer were changed. That is, in Example 1, after forming the chromium layer as the first layer by the FCVA, the chromium layer formed by the sputtering and the chromium layer formed by the FCVA were alternately stacked; and this alternate stacking was repeated three times (three cycles). On the other hand, the alternate stacking was repeated four times in Example 7. The total of the thicknesses of the respective films of the stacked body was 1275 nm.

TABLE 15

| | Layer | Composition | Film-Forming Method | Bias | Thickness of Film |
|---|---|---|---|---|---|
| EXAMPLE 7 | Substrate | PC | — | — | — |
| | 1 | Cr | FCVA | — | 25 nm |
| | 2 | Cr | Sp | — | 125 nm |
| | 3 | Cr | FCVA | — | 25 nm |
| | 4 | Cr | Sp | — | 125 nm |
| | 5 | Cr | FCVA | — | 25 nm |
| | 6 | Cr | Sp | — | 125 nm |
| | 7 | Cr | FCVA | — | 25 nm |
| | 8 | Cr | Sp | — | 125 nm |
| | 9 | Cr | FCVA | — | 25 nm |
| | 10 | CrNx | Sp | — | 125 nm |
| | 11 | CrNx | FCVA | — | 20 nm |
| | 12 | CrNx | Sp | −150 V | 125 nm |
| | 13 | CrNx | FCVA | −150 V | 20 nm |
| | 14 | CrNx | Sp | −150 V | 125 nm |
| | 15 | CrNx | FCVA | −150 V | 20 nm |
| | 16 | CrNx | Sp | −150 V | 125 nm |
| | 17 | CrNx | FCVA | −150 V | 54 nm |

With respect to the composite plastic member produced in this example, four kinds of tests including the initial adhesion test, the high-temperature and high-humidity test, the thermal shock test, and the attachment and detachment test were carried out in a similar manner to Example 1; and each of the characteristics of the composite plastic member of this example was evaluated.

Table 16 shows the evaluation result of the composite plastic member of this example. According to the initial adhesion test executed with respect to 9 samples, all of the 9 samples passed the test. According to the high-temperature and high-humidity test executed with respect to 9 samples under the condition 2 as described above, all of the 9 samples passed the test. According to the thermal shock test executed with respect to 9 samples, all of the 9 samples passed the test. Further, according to the attachment and detachment test in which the attachment and detachment was executed for the predetermined target number of times, the exposure of the substrate was not confirmed.

TABLE 16

| Initial Adhesion Test (The number of samples which passed the test/the number of samples) | High-Temperature and High-Humidity Test (The number of samples which passed the test/ the number of samples) Condition 2 | Thermal Shock Test (The number of samples which passed the test/the number of samples) | Attachment and detachment Test |
|---|---|---|---|
| 9/9 | 9/9 | 9/9 | After executing attaching/detaching for target number of times, Substrate was not exposed |

Comparative Example 1

In Comparative Example 1, there was produced a composite plastic member having a stacked body comprised of three layers all of which were formed by the sputtering and formed on a plastic substrate. Similar to Example 1, a lens mount made of polycarbonate (PC) was used as the plastic substrate. Table 17 shows the composition of each of the layers forming the stacked body of the composite plastic member of this comparative example, the type of the film-forming method of each layer, the presence or absence of application of the bias voltage with respect to each layer, and the thickness of each layer. In Table 17, a layer disposed directly on the substrate is the first layer, and a number assigned to each layer becomes larger in an ascending order starting from the layer disposed directly on the substrate. That is, the uppermost layer is the third layer.

TABLE 17

| | Layer | Composition | Film-Forming Method | Bias | Thickness of Film |
|---|---|---|---|---|---|
| COMPARATIVE EXAMPLE 1 | Substrate | PC | — | — | — |
| | 1 | Cr | Sp | — | 520 nm |
| | 2 | CrNx | Sp | — | 155 nm |
| | 3 | CrNx | Sp | −150 V | 360 nm |

The first layer of the composite plastic member in this comparative example was the chromium layer formed by the sputtering without applying the bias voltage. This first layer was produced by the same method as the second layer of Example 1, and was made to have a thickness of 520 nm. The second layer was the chromium nitride layer formed by the sputtering without applying the bias voltage. The second layer was produced by the same method as the eighth layer of Example 1, and was made to have a thickness of 155 nm. The third layer was the chromium nitride layer formed by the sputtering while applying the bias voltage. The third layer was produced by the same method as the tenth layer of Example 1, and was made to have a thickness of 360 nm. The total of the thicknesses of the respective films of the stacked body of the composite plastic member in this comparative example was 1035 nm, and was substantially same as the total of the thicknesses of the respective films of the stacked body of the composite plastic member in Example 1.

With respect to the composite plastic member produced in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated.

Table 18 shows the evaluation result of the composite plastic member of this comparative example. According to the initial adhesion test executed with respect to 9 samples, all of the 9 samples passed the test. According to the high-temperature and high-humidity test executed with respect to 9 samples under the condition 2 as described above, all of the 9 samples passed the test. According to the thermal shock test executed with respect to 9 samples, all of the 9 samples passed the test. However, according to the attachment and detachment test, the exposure of the substrate of the composite plastic member was confirmed at the point in time at which the attachment and detachment was executed for 75% of the target number of times.

TABLE 18

| Initial Adhesion Test (The number of samples which passed the test/the number of samples) | High-Temperature and High-Humidity Test (The number of samples which passed the test/ the number of samples) Condition 2 | Thermal Shock Test (The number of samples which passed the test/the number of samples) | Attachment and detachment Test |
|---|---|---|---|
| 9/9 | 9/9 | 9/9 | After executing attaching/detaching for 75% of target number of times, Substrate was exposed |

Comparative Example 2

In Comparative Example 2, there was produced a composite plastic member having a stacked body comprised of two layers both of which were formed by the FCVA and formed on a plastic substrate. Similar to Example 1, a lens mount made of polycarbonate (PC) was used as the plastic substrate. Table 19 shows the composition of each of the layers forming the stacked body of this comparative example, the type of the film-forming method of each layer, the presence or absence of application of the bias voltage with respect each layer, and the thickness of each layer. In Table 19, a layer disposed directly on the substrate is the first layer, and the uppermost layer stacked on the first layer is the second layer. That is, the chromium layer was formed as a single layer, rather than being formed as the alternate stacked body. Further, the chromium nitride layer was formed as a single layer, rather than being formed as the alternate stacked body.

TABLE 19

| | Structure of Layer | | | | |
|---|---|---|---|---|---|
| | Layer | Composition | Film-Forming Method | Bias | Thickness of Film |
| COMPARATIVE EXAMPLE 2 | Substrate | PC | — | — | — |
| | 1 | Cr | FCVA | — | 100 nm |
| | 2 | CrN$x$ | FCVA | −150 V | 1200 nm |

The first layer in this comparative example was the chromium layer formed by the FCVA without applying the bias voltage. This first layer was formed by the same method as the first layer of Example 1, and was made to have a thickness of 100 nm. The second layer of this comparative example was the chromium nitride layer formed by the FCVA while applying the bias voltage. This second layer was formed by the same method as the eleventh layer of Example 1, and was made to have a thickness of 1200 nm. The total of the thicknesses of the respective films of the stacked body of the composite plastic member in this comparative example was 1300 nm, and was substantially same as the total of the thicknesses of the respective films of the stacked body of the composite plastic member in Example 4.

The attachment and detachment test was carried out with respect to the composite plastic member in this comparative example in a similar manner to Example 1. However, the adhesion to the substrate of the stacked body in this comparative example was very low and the substrate was exposed before the composite plastic member was attached to the mating component. Thus, the evaluation could not be performed. Therefore, three kinds of all remaining evaluation tests including the initial adhesion test, the high-temperature and high-humidity test, and the thermal shock test were not carried out.

Comparative Example 3

In Comparative Example 3, there was produced a composite plastic member which has a stacked body comprised of seventeen layers and formed on a plastic substrate. As the plastic substrate, a lens mount made of polycarbonate (PC) which was same as that used in Example 1 was used. Table 20 shows the composition of each of the layers forming the stacked body of this comparative example, the type of the film-forming method of each layer, the presence or absence of application of the bias voltage with respect to each layer, and the thickness of each layer. In Table 20, a layer disposed directly on the substrate is the first layer, and a number assigned to each layer becomes larger in an ascending order starting from the layer disposed directly on the substrate. That is, the uppermost layer is the seventeenth layer.

TABLE 20

| | Layer | Composition | Film-Forming Method | Bias | Thickness of Film |
|---|---|---|---|---|---|
| COMPARATIVE EXAMPLE 3 | Substrate | PC | — | — | — |
| | 1 | CrNx | Sp | — | 120 nm |
| | 2 | CrNx | FCVA | — | 35 nm |
| | 3 | CrNx | Sp | — | 120 nm |
| | 4 | CrNx | FCVA | — | 35 nm |
| | 5 | CrNx | Sp | — | 120 nm |
| | 6 | CrNx | FCVA | — | 35 nm |
| | 7 | CrNx | Sp | — | 120 nm |
| | 8 | CrNx | FCVA | — | 35 nm |
| | 9 | CrNx | Sp | — | 120 nm |
| | 10 | CrNx | FCVA | — | 35 nm |
| | 11 | CrNx | Sp | — | 120 nm |
| | 12 | CrNx | FCVA | — | 35 nm |
| | 13 | CrNx | Sp | — | 120 nm |
| | 14 | CrNx | FCVA | — | 35 nm |
| | 15 | CrNx | Sp | — | 120 nm |
| | 16 | CrNx | FCVA | — | 35 nm |
| | 17 | CrNx | Sp | — | 120 nm |

The stacked body in this comparative example is formed only of the chromium nitride layers; and does not include the chromium layer. The first layer of this comparative example was the chromium nitride layer formed by the sputtering without applying the bias voltage, was formed by the same method as the eighth layer of Example 1, and was made to have a thickness of 120 nm. The second layer of this comparative example was the chromium nitride layer formed by the FCVA without applying the bias voltage. This second layer was formed by the same method as the ninth layer of Example 1, and was made to have a thickness of 35 nm. The first layer and the second layer formed as described above were regarded as one pair; and subsequently, seven pairs, each of which was similarly formed as said one pair, were stacked to form sixteen layers in total. Then, a chromium nitride layer having the thickness of 120 nm was formed, as the seventeenth layer which was the uppermost layer, on the sixteenth layer, by the sputtering without applying the bias voltage in a similar manner as that of the eighth layer in Example 1. The total of the thicknesses of the respective films of the stacked body of the composite plastic member in this comparative example was 1495 nm.

With respect to the composite plastic member in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated.

Table 21 shows the evaluation result of the composite plastic member of this comparative example. According to the initial adhesion test executed with respect to 2 samples, all of the 2 samples passed the test. According to the high-temperature and high-humidity test executed with respect to 2 samples under the condition 2 as described above, only 1 sample passed the test. According to the thermal shock test executed with respect to 2 samples, all of the 2 samples passed the test. Further, according to the attachment and detachment test, the exposure of the substrate was confirmed at the point in time at which the attachment and detachment was executed for 19% of the target number of times.

TABLE 21

| Initial Adhesion Test (The number of samples which passed the test/the number of samples) | High-Temperature and High-Humidity Test (The number of samples which passed the test/the number of samples) Condition 2 | Thermal Shock Test (The number of samples which passed the test/the number of samples) | Attachment and detachment Test |
|---|---|---|---|
| 2/2 | 1/2 | 2/2 | After executing attaching/detaching for 19% of target number of times, Substrate was exposed |

Comparative Example 4

In Comparative Example 4, there was produced a composite plastic member which has a stacked body comprised of nineteen layers and formed on a plastic substrate. As the plastic substrate, a lens mount made of polycarbonate (PC) which was same as that used in Example 1 was used. Table 22 shows the composition of each of the layers forming the stacked body of this comparative example, the type of the film-forming method of each layer, the presence or absence of application of the bias voltage with respect to each layer, and the thickness of each layer. In Table 22, a layer disposed directly on the substrate is the first layer, and a number assigned to each layer becomes larger in an ascending order starting from the layer disposed directly on the substrate. That is, the uppermost layer is the seventeenth layer.

TABLE 22

| | Layer | Composition | Film-Forming Method | Bias | Thickness of Film |
|---|---|---|---|---|---|
| COMPARATIVE EXAMPLE 4 | Substrate | PC | — | — | — |
| | 1 | Cr | FCVA | — | 100 nm |
| | 2 | CrNx | Sp | — | 120 nm |
| | 3 | CrNx | FCVA | — | 35 nm |
| | 4 | CrNx | Sp | — | 120 nm |
| | 5 | CrNx | FCVA | — | 35 nm |
| | 6 | CrNx | Sp | — | 120 nm |
| | 7 | CrNx | FCVA | — | 35 nm |
| | 8 | CrNx | Sp | — | 120 nm |
| | 9 | CrNx | FCVA | — | 35 nm |
| | 10 | CrNx | Sp | — | 120 nm |
| | 11 | CrNx | FCVA | — | 35 nm |
| | 12 | CrNx | Sp | — | 120 nm |
| | 13 | CrNx | FCVA | — | 35 nm |
| | 14 | CrNx | Sp | −150 V | 120 nm |
| | 15 | CrNx | FCVA | −150 V | 35 nm |
| | 16 | CrNx | Sp | −150 V | 120 nm |
| | 17 | CrNx | FCVA | −150 V | 35 nm |
| | 18 | CrNx | Sp | −150 V | 120 nm |
| | 19 | CrNx | FCVA | −150 V | 120 nm |

In the stacked body of this comparative example, only the first layer was formed of the chromium layer; and each of the remaining layers was formed of the chromium nitride layer. The first layer of this comparative example was formed by the FCVA. With respect to the fourteenth to nineteenth layers, the layer formed by the sputtering and the layer formed by the FCVA were alternately stacked while applying the bias voltage under the conditions which were same as the film-forming conditions of the tenth and eleventh layers in Example 1, except for the thickness. In this comparative example, any chromium layers were not alternately stacked on the chromium layer as the first layer formed by the FCVA; and this comparative example was in contrast with Example 1 in this point. The total of the thicknesses of the respective films of the stacked body of the composite plastic member in this comparative example was 1545 nm.

With respect to the composite plastic member in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated.

Table 23 shows the evaluation result of the composite plastic member of this comparative example. According to the initial adhesion test executed with respect to 4 samples, all of the 4 samples passed the test. According to the high-temperature and high-humidity test executed with respect to 2 samples under the condition 2 as described above, all of the 2 samples passed the test. According to the thermal shock test executed with respect to 2 samples, all of the 2 samples passed the test. However, according to the attachment and detachment test, the exposure of the substrate was confirmed at the point in time at which the attachment and detachment was executed for 31% of the target number of times.

TABLE 23

| Initial Adhesion Test (The number of samples which passed the test/ the number of samples) | High-Temperature and High-Humidity Test (The number of samples which passed the test/ the number of samples) Condition 2 | Thermal Shock Test (The number of samples which passed the test/ the number of samples) | Attachment and detachment Test |
| --- | --- | --- | --- |
| 4/4 | 2/2 | 2/2 | After executing attaching/detaching for 31% of target number of times, Substrate was exposed |

Comparative Example 5

In Comparative Example 5, there was produced a member in which one chromium layer was formed on a substrate made of brass having the similar shape as that used in Example 1. The chromium layer was formed by wet plating; and the thickness was 4 μm. Table 24 shows the composition of the layer forming the stacked body of this comparative example, the type of the film-forming method, and the film thickness.

TABLE 24

| | Structure of Layer | | | |
| --- | --- | --- | --- | --- |
| | Layer | Composition | Film-Forming Method | Thickness of Film |
| COMPARATIVE EXAMPLE 4 | Substrate 1 | Brass Cr | — Wet Plating | — 4 μm |

With respect to the member in this comparative example, four kinds of tests including the initial adhesion test, the high-temperature and high-humidity test, the thermal shock test, and the attachment and detachment test were carried out in a similar manner to Example 1; and each of the characteristics of the member of this comparative example was evaluated.

Table 25 shows the evaluation result of the member of this comparative example. According to the initial adhesion test executed with respect to 20 samples, all of the 20 samples passed the test. According to the high-temperature and high-humidity test executed with respect to 20 samples under the condition 2 as described above, all of the 20 samples passed the test. According to the thermal shock test executed with respect to 20 samples, all of the 20 samples passed the test. However, according to the attachment and detachment test, the exposure of the substrate was confirmed at the point in time at which the attachment and detachment was executed for 7% of the target number of times.

TABLE 25

| Initial Adhesion Test (The number of samples which passed the test/ the number of samples) | High-Temperature and High-Humidity Test (The number of samples which passed the test/ the number of samples) Condition 2 | Thermal Shock Test (The number of samples which passed the test/ the number of samples) | Attachment and detachment Test |
| --- | --- | --- | --- |
| 20/20 | 20/20 | 20/20 | After executing attaching/detaching for 7% of target number of times, Substrate was exposed |

Comparative Example 6

In Comparative Example 6, there was produced a member in which one chromium nitride layer was formed on a substrate made of brass having the similar shape as that used in Example 1. The chromium nitride layer of this comparative example was the chromium nitride layer formed by the FCVA while applying the bias voltage. This chromium nitride layer was formed by the same method as the eleventh layer of Example 1, and was made to have a film thickness of 2 μm. Table 26 shows the composition of the layer forming the stacked body of this comparative example, the type of the film-forming method, the presence or absence of application of the bias voltage, and the film thickness.

TABLE 26

| | Structure of Layer | | | | |
| --- | --- | --- | --- | --- | --- |
| | Layer | Composition | Film-Forming Method | Bias | Thickness of Film |
| COMPARATIVE EXAMPLE 6 | Substrate 1 | Brass CrNx | — FCVA | — −150 V | — 2 μm |

With respect to the member in this comparative example, four kinds of tests including the initial adhesion test, the high-temperature and high-humidity test, the thermal shock test, and the attachment and detachment test were carried out in a similar manner to Example 1; and each of the characteristics of the member of this comparative example was evaluated.

Table 27 shows the evaluation result of the member of this comparative example. According to the initial adhesion test executed with respect to 20 samples, all of the 20 samples passed the test. According to the high-temperature and high-humidity test executed with respect to 20 samples under the condition 2 as described above, all of the 20 samples passed the test. According to the thermal shock test executed with respect to 20 samples, all of the 20 samples passed the test. However, according to the attachment and detachment test, the exposure of the substrate was confirmed at the point in time at which the attachment and detachment was executed for 87% of the target number of times.

TABLE 27

| Initial Adhesion Test (The number of samples which passed the test/ the number of samples) | High-Temperature and High-Humidity Test (The number of samples which passed the test/ the number of samples) Condition 2 | Thermal Shock Test (The number of samples which passed the test/ the number of samples) | Attachment and detachment Test |
|---|---|---|---|
| 20/20 | 20/20 | 20/20 | After executing attaching/detaching for 87% of target number of times, Substrate was exposed |

Comparative Example 7

In Comparative Example 7, there was produced a member in which two layers of stacked body was formed on a substrate made of brass having the similar shape as that used in Example 1. Table 28 shows the composition of each of the layers forming the stacked body of this comparative example, the type of the film-forming method of each layer, the presence or absence of application of the bias voltage with respect to each layer, and the film thickness of each layer. In Table 28, a layer disposed directly on the substrate is the first layer, and the uppermost layer stacked on the first layer is the second layer.

TABLE 28

| | | Structure of Layer | | | |
|---|---|---|---|---|---|
| | Layer | Composition | Film-Forming Method | Bias | Thickness of Film |
| COMPARATIVE EXAMPLE 7 | Substrate | Brass | — | — | — |
| | 1 | Cr | FCVA | −150 V | 50 nm |
| | 2 | CrN$x$ | FCVA | −150 V | 2 μm |

With respect to the stacked body of this comparative example, all of the layers were produced by the FCVA. The first layer of this comparative example was the chromium layer formed by the FCVA while applying the bias voltage. This first layer was formed by the same method as the first layer of Example 1, except that the application of −150V bias voltage was performed for this first layer; and this first layer was made to have a film thickness of 50 nm. The second layer of this comparative example was the chromium nitride layer formed by the FCVA while applying the bias voltage. The second layer was formed by the same method as the eleventh layer of Example 1; and was made to have a film thickness of 2 μm.

With respect to the member in this comparative example, four kinds of tests including the initial adhesion test, the high-temperature and high-humidity test, the thermal shock test, and the attachment and detachment test were carried out in a similar manner to Example 1; and each of the characteristics of the member of this comparative example was evaluated.

Table 29 shows the evaluation result of the member of this comparative example. According to the initial adhesion test executed with respect to 100 samples, all of the 100 samples passed the test. According to the high-temperature and high-humidity test executed with respect to 100 samples under the condition 2 as described above, all of the 100 samples passed the test. According to the thermal shock test executed with respect to 100 samples, all of the 100 samples passed the test. Further, according to the attachment and detachment test in which the attachment and detachment was executed for 2.5 times of the target number of times, the exposure of the substrate was not confirmed.

TABLE 29

| Initial Adhesion Test (The number of samples which passed the test/ the number of samples) | High-Temperature and High-Humidity Test (The number of samples which passed the test/the number of samples) Condition 2 | Thermal Shock Test (The number of samples which passed the test/the number of samples) | Attachment and detachment Test |
|---|---|---|---|
| 100/100 | 100/100 | 100/100 | After executing attaching/detaching for 2.5 times of target number of times, Substrate was not exposed |

Comparative Example 8

In Comparative Example 8, there was produced a composite plastic member which has a stacked body comprised of thirteen layers and formed on a plastic substrate. As the plastic substrate, a lens mount made of polycarbonate (PC) which was same as that used in Example 1 was used. Table 30 shows the composition of each of the layers forming the stacked body of this comparative example, the type of the film-forming method of each layer, the presence or absence of application of the bias voltage with respect to each layer, and the film thickness of each layer. In Table 30, a layer disposed directly on the substrate is the first layer, and a number assigned to each layer becomes larger in an ascending order starting from the layer disposed directly on the substrate. That is, the uppermost layer is the thirteenth layer.

TABLE 30

| | Structure of Layer | | | |
|---|---|---|---|---|
| | Layer | Composition | Film-Forming Method | Bias | Thickness of Film |
| Comparative Example 8 | Substrate | PC | — | — | — |
| | 1 | Cr | FCVA | — | 10 nm |
| | 2 | Cr | Sp | — | 125 nm |
| | 3 | Cr | FCVA | — | 20 nm |
| | 4 | Cr | Sp | — | 125 nm |
| | 5 | Cr | FCVA | — | 20 nm |
| | 6 | Cr | Sp | — | 125 nm |
| | 7 | Cr | FCVA | — | 20 nm |
| | 8 | CrNx | Sp | — | 125 nm |
| | 9 | CrNx | FCVA | — | 20 nm |
| | 10 | CrNx | Sp | −150 V | 125 nm |
| | 11 | CrNx | FCVA | −150 V | 20 nm |
| | 12 | CrNx | Sp | −150 V | 125 nm |
| | 13 | CrNx | FCVA | −150 V | 20 nm |

In this comparative example, the structure in Comparative Example 8 was same as that in Example 1, except that the film thickness of the first layer was made to have an extremely thin thickness of 10 nm and that the thirteenth layer had the thickness of 20 nm; and the composite plastic member was produced in a similar manner to Example 1. The total of the thicknesses of the respective films of the stacked body in this comparative example was 880 nm.

With respect to the composite plastic member in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated.

Table 31 shows the evaluation result of the composite plastic member of this comparative example. According to the initial adhesion test executed with respect to 118 samples, 104 samples passed the test. According to the high-temperature and high-humidity test executed with respect to 117 samples under the condition 2 as described above, 86 samples passed the test. According to the thermal shock test executed with respect to 100 samples, 88 samples passed the test. Further, although the attachment and detachment test was carried out, the adhesion to the substrate of the stacked body in this comparative example was very low and the substrate was exposed before the composite plastic member was attached to the mating component. Thus, the evaluation could not be performed.

TABLE 31

| Initial Adhesion Test (The number of samples which passed the test/the number of samples) | High-Temperature and High-Humidity Test (The number of samples which passed the test/the number of samples) Condition 2 | Thermal Shock Test (The number of samples which passed the test/the number of samples) | Attachment and detachment Test |
|---|---|---|---|
| 104/118 | 86/117 | 88/100 | Evaluation could not be performed |

Comparative Example 9

In Comparative Example 9, a composite plastic member which had a stacked body comprised of seventeen layers and formed on a plastic substrate was produced as indicated in Table 32 below in a similar manner to Example 7, except that the number of stacked layers and the thickness with respect to each chromium layer and each chromium nitride layer were changed from those in Example 7.

TABLE 32

| | Structure of Layer | | | |
|---|---|---|---|---|
| | Layer | Composition | Film-Forming Method | Bias | Thickness of Film |
| COMPARATIVE EXAMPLE 9 | Substrate | PC | — | — | — |
| | 1 | Cr | FCVA | — | 40 nm |
| | 2 | Cr | Sp | — | 90 nm |
| | 3 | Cr | FCVA | — | 40 nm |
| | 4 | Cr | Sp | — | 90 nm |
| | 5 | Cr | FCVA | — | 40 nm |
| | 6 | Cr | Sp | — | 90 nm |
| | 7 | Cr | FCVA | — | 40 nm |
| | 8 | Cr | Sp | — | 90 nm |
| | 9 | Cr | FCVA | — | 40 nm |
| | 10 | CrNx | Sp | — | 90 nm |
| | 11 | CrNx | FCVA | — | 40 nm |
| | 12 | CrNx | Sp | −150 V | 90 nm |
| | 13 | CrNx | FCVA | −150 V | 40 nm |
| | 14 | CrNx | Sp | −150 V | 90 nm |
| | 15 | CrNx | FCVA | −150 V | 40 nm |
| | 16 | CrNx | Sp | −150 V | 90 nm |
| | 17 | CrNx | FCVA | −150 V | 50 nm |

In this comparative example, each of the layers formed by the sputtering was made to have the thickness of 90 nm; and each of the layers formed by the FCVA was made to have the thickness of 40 nm (except for the uppermost layer). That is, the ratio of the film thickness of each of the layers formed by the FCVA to the film thickness of each of the layers formed by the sputtering was 44% both in the alternate stacked body formed by the chromium layers and the alternate stacked body formed by the chromium nitride layers. Further, the total of the thicknesses of the respective films of the stacked body in this comparative example was 1094 nm.

With respect to the composite plastic member in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated.

Table 33 shows the evaluation result of the composite plastic member of this comparative example. According to the initial adhesion test executed with respect to 16 samples, no sample passed the test. According to the high-temperature and high-humidity test executed with respect to 16 samples under the condition 2 as described above, no sample passed the test. According to the thermal shock test executed with respect to 16 samples, no sample passed the test. Further, according to the attachment and detachment test, the exposure of the substrate was confirmed at the point in time at which the attachment and detachment was executed for 10% of the target number of times.

TABLE 33

| Initial Adhesion Test (The number of samples which passed the test/the number of samples) | High-Temperature and High-Humidity Test (The number of samples which passed the test/the number of samples) Condition 2 | Thermal Shock Test (The number of samples which passed the test/the number of samples) | Attachment and detachment Test |
|---|---|---|---|
| 0/16 | 0/16 | 0/16 | After executing attaching/detaching for 10% of target number of times, Substrate was exposed |

Comparative Example 10

In this comparative example, a composite plastic member was produced as indicated in Table 34 below, in a similar manner as Example 6, except that the number of stacked layers and the thickness with respect to each chromium layer and each chromium nitride layer were changed from those in Example 6. That is, in this comparative example, the structure in this comparative example was same as that in Example 6 and the composite plastic member was produced in a similar manner as Example 6, except that each of the layers formed by the sputtering was made to have the thickness of 225 nm and that each of the layers formed by the FCVA was made to have the thickness of 25 nm (except for the uppermost layer). The ratio of the film thickness of each of the layers formed by the FCVA to the thickness of each layer formed by the sputtering was 11% both in the alternate stacked body formed by the chromium layers and the alternate stacked body formed by the chromium nitride layers. Further, the total of the thicknesses of the respective films of the stacked body in this comparative example was 1300 nm.

TABLE 34

| | | Structure of Layer | | |
|---|---|---|---|---|
| | Layer | Composition | Film-Forming Method | Bias | Thickness of Film |
| COMPARATIVE EXAMPLE 10 | Substrate | PC | — | — | — |
| | 1 | Cr | FCVA | — | 25 nm |
| | 2 | Cr | Sp | — | 225 nm |
| | 3 | Cr | FCVA | — | 25 nm |
| | 4 | Cr | Sp | — | 225 nm |
| | 5 | Cr | FCVA | — | 25 nm |
| | 6 | CrNx | Sp | — | 225 nm |
| | 7 | CrNx | FCVA | — | 25 nm |
| | 8 | CrNx | Sp | −150 V | 225 nm |
| | 9 | CrNx | FCVA | −150 V | 25 nm |
| | 10 | CrNx | Sp | −150 V | 225 nm |
| | 11 | CrNx | FCVA | −150 V | 50 nm |

With respect to the composite plastic member in this comparative example, four kinds of tests including the initial adhesion test, the high-temperature and high-humidity test, the thermal shock test, and the attachment and detachment test were carried out in a similar manner to Example 1; and each of the characteristics of the composite plastic member of this comparative example was evaluated. Table 35 shows the evaluation result of the composite plastic member of this comparative example. According to the initial adhesion test executed with respect to 10 samples, all of the 10 samples passed the test. According to the high-temperature and high-humidity test executed with respect to 10 samples under the condition 2 as described above, all of the 10 samples passed the test. According to the thermal shock test executed with respect to 10 samples, 8 samples passed the test. However, according to the attachment and detachment test, the exposure of the substrate was confirmed at the point in time at which the attachment and detachment was executed for 75% of the target number of times.

TABLE 35

| Initial Adhesion Test (The number of samples which passed the test/the number of samples) | High-Temperature and High-Humidity Test (The number of samples which passed the test/the number of samples) Condition 2 | Thermal Shock Test (The number of samples which passed the test/the number of samples) | Attachment and detachment Test |
|---|---|---|---|
| 10/10 | 10/10 | 8/10 | After executing attaching/detaching for 75% of target number of times, Substrate was exposed |

As described above, each of the characteristics of the composite plastic member was evaluated by the examples and the comparative examples. Then, the following facts have been found out. That is, by making the stacked body on the side of the plastic substrate as the alternate stacked body formed of chromium layers and by making the stacked body on the side close to the outside surface of the composite plastic member as the alternate stacked body formed of chromium nitride layers, the excellent adhesion to the plastic substrate is provided; and it is possible to inexpensively provide the composite plastic member having the sufficient durability and wear resistance. In particular, the composite plastic member has the sufficient wear resistance as compared with Comparative Example 5 in which the wet plating was applied on the substrate made of brass; and further, the composite plastic member has the sufficient wear resistance also as compared with Comparative Example 6 in which the chromium nitride layer was formed by the FCVA on the substrate made of brass. Since the stacked body is formed of the chromium layers and the chromium nitride layers each having a predetermined nitrogen-content amount, the stacked body has the conductivity and the excellent metallic luster. Further, as the film-forming method, since the FCVA and the sputtering are used in combination by using the apparatus as shown in FIG. 2, it is possible to efficiently form the chromium layers which contact with each other from above and below (in up/down direction) and which have different degrees of hardness, and the chromium nitride layers which contact with each other from above and below and which have different degrees of hardness.

According to the examples as described above, the chromium layer formed by the FCVA and the chromium layer formed by the sputtering were alternately stacked on the plastic substrate; and the chromium nitride layer formed by the FCVA and the chromium nitride layer formed by the sputtering were alternately stacked while controlling the bias voltage. However, it is not necessarily indispensable to control the bias voltage when stacking the chromium nitride layers. The FCVA and the sputtering may be performed without applying the bias voltage.

According to the examples as described above, the chromium layer formed by the FCVA and the chromium layer formed by the sputtering were alternately stacked on the plastic substrate; and the chromium nitride layer formed by the FCVA and the chromium nitride layer formed by the sputtering were alternately stacked while controlling the bias voltage. However, a composite plastic member in which only the chromium layers are alternately stacked on the plastic substrate by the FCVA and the sputtering is also encompassed by the present application. Also in this case, as compared with a case in which the chromium layers are stacked only by the sputtering, it is possible to make the chromium layer be adhered on the soft plastic substrate satisfactorily, and to improve the wear resistance, the toughness, and the sliding performance of the chromium stacked body. Further, although the substrate made of polycarbonate was used as the plastic substrate, any resin substrate may be used provided that the resin can be subjected to the injection molding.

According to the aspect and the embodiments (examples) described above, it is possible to provide the composite plastic member in which the stacked body having the high wear resistance, the sufficient sliding performance, the conductivity, and the excellent exterior appearance is provided to be tightly adhered on the plastic substrate which can be subjected to the molding. Therefore, by using this composite plastic member, it is possible to inexpensively produce a member in any shape requiring the wear resistance, the sliding performance, the conductivity, and the excellent exterior appearance. In particular, this plastic member is suitable for the lens mount for the camera or the body mount for the camera which moves slidably relative to and is connected to another member, thus contributing to realize light weight, mass production, and production-cost reduction for the camera component(s).

Further, the composite plastic member according to the aspect as described above is applicable to any other optical apparatus system and components thereof, or an apparatus for producing any other optical apparatus system and components thereof, without being limited to the lens mount for the camera or the body mount for the camera. The optical apparatus system includes an optical apparatus and an attached device or auxiliary equipment thereof. The optical apparatus included in the optical apparatus system can be exemplified by a camera body for a single-lens reflex, a lens for the single-lens reflex, a compact camera body, a lens for the compact camera, a mobile terminal having an imaging function such as a mobile phone, an imaging module built in or incorporated in each of the devices as described above, etc. Further, the attached device included in the optical apparatus system is exemplified by an illumination device such as a flush and an LED light, a GPS device, a remote control device, a data communication device, a lens hood, etc.

The member for the optical apparatus system according to the aspect described above is exemplified by a casing of the camera body, a lens barrel for the camera lens, operation rings such as a focusing ring and a zoom ring, various operation buttons, an ornamental member, a shutter mechanism component, a sliding member of an accessory attaching section, etc., in addition to the mount member. Note that the composite plastic member according to the aspect described above can be used also as a member of a manufacturing apparatus and/or a detection apparatus in a manufacturing process of each of the apparatuses (devices) and each of the members as described above. A specific example of the member as described above can be exemplified by an examination tool which is used to test durability of a sliding section in a manufacturing process of the sliding component and an apparatus having the sliding component.

What is claimed is:

1. A method for producing a composite plastic member, the method comprising:
    a step of forming a first stacked body on a plastic substrate, the first stacked body having multiple chromium layers, the multiple chromium layers being alternately formed by FCVA and by sputtering; and
    a step of forming a second stacked body on the first stacked body, the second stacked body having multiple chromium nitride layers, the multiple chromium nitride layers being alternately formed by the FCVA and by the sputtering,
    wherein an uppermost layer of the composite plastic member is one of the multiple chromium nitride layers formed by the FCVA.

2. The method for producing the composite plastic member according to claim 1, wherein a first one of the multiple chromium layers is formed on the plastic substrate by the FCVA.

3. The method for producing the composite plastic member according to claim 1, wherein the second stacked body is formed by alternately stacking the chromium nitride layers such that the chromium nitride layer formed by the FCVA has a thickness which is not more than 40% of a thickness of the chromium nitride layer formed by the sputtering.

4. The method for producing the composite plastic member according to claim 1, wherein the first stacked body is formed by alternately stacking the chromium layers such that the chromium layer formed by the FCVA has a thickness which is not more than 40% of a thickness of the chromium layer formed by the sputtering.

5. The method for producing the composite plastic member according to claim 1, wherein no bias voltage is applied when the chromium layers are formed by the FCVA and by the sputtering, respectively; and
    a bias voltage is applied when at least one of the chromium nitride layers is formed by the sputtering.

6. The method for producing the composite plastic member according to claim 1, wherein a flow rate of a gas, containing nitrogen and used for forming the chromium nitride layers, is changed at a constant time interval.

7. The method for producing the composite plastic member according to claim 1, wherein the plastic substrate is a molded lens mount member for a camera or a molded body mount member for the camera.

* * * * *